(12) United States Patent
Lee et al.

(10) Patent No.: US 12,745,440 B2
(45) Date of Patent: Sep. 22, 2026

(54) GATE STRUCTURES IN SEMICONDUCTOR DEVICES

(71) Applicant: Taiwan Semiconductor Manufacturing Company, Ltd., Hsinchu (TW)

(72) Inventors: Shen-Yang Lee, Miaoli County (TW); Hsiang-Pi Chang, New Taipei City (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 520 days.

(21) Appl. No.: 18/183,551

(22) Filed: Mar. 14, 2023

(65) Prior Publication Data

US 2024/0313064 A1 Sep. 19, 2024

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ........... *H10D 64/01* (2025.01); *H10D 30/014* (2025.01); *H10D 30/031* (2025.01); *H10D 30/43* (2025.01); *H10D 30/6735* (2025.01); *H10D 30/6739* (2025.01); *H10D 84/0181* (2025.01); *H10D 84/038* (2025.01); *H10D 84/85* (2025.01)

(58) Field of Classification Search

CPC .... H10D 64/01; H10D 64/685; H10D 30/014; H10D 30/031; H10D 30/43; H10D 30/6735; H10D 30/6739; H10D 30/6757; H10D 84/0181; H10D 84/038; H10D 84/85; H10D 84/83; H10D 62/121

See application file for complete search history.

(56) References Cited

U.S. PATENT DOCUMENTS

| | | | |
|---|---|---|---|
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |

(Continued)

FOREIGN PATENT DOCUMENTS

TW 202147410 A * 12/2021 ........... H10D 64/514

*Primary Examiner* — Calvin Y Choi

(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming nanostructured channel regions on a fin or sheet base, forming gate openings surrounding the nanostructured channel regions, forming oxide layers on exposed surfaces of the nanostructured channel regions and the fin or sheet base in the gate openings, performing a first doping process on the oxide layers to form doped oxide layers, depositing a first dielectric layer on the doped oxide layers, performing a second doping process on the first dielectric layer to form a doped dielectric layer, and depositing a conductive layer on the doped dielectric layer.

20 Claims, 38 Drawing Sheets

(56) References Cited

U.S. PATENT DOCUMENTS

| | | | | |
|---|---|---|---|---|
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 2011/0309333 | A1* | 12/2011 | Cheng .................. | H10D 30/601<br>977/762 |
| 2022/0336289 | A1* | 10/2022 | Savant ................. | H10D 62/121 |

* cited by examiner

112A1
112A2
112A3
D-IL
D-IL
D-IL
122N1
140N
121N
122N2
140N
121N
122N3
140N
121N
N1
N2
N3

112B1
112B2
112B3
IL
IL
IL
122P1
121P
122P2
121P
122P3
121P
T1
T2
T3

X
Y
Z
X
Y
Z

112A1
1748
1346
1146
946
825N1
122N1
140N
121N
D-IL
N1
112A2
1748
1346
1146
825N2
122N2
140N
121N
D-IL
N2
112A3
1748
1346
825N3
122N3
140N
121N
D-IL
N3

112B1
1748
825P1
122P1
121P
IL
112B2
1748
825P2
122P2
121P
IL
112B3
1748
1548
825P3
122P3
121P
IL

X
Y
Z

GATE STRUCTURES IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-22B illustrate cross-sectional views of a semiconductor device with different gate structures at various stages of its fabrication process, in accordance with some embodiments.

FIGS. 26A-29B illustrate cross-sectional views of another semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
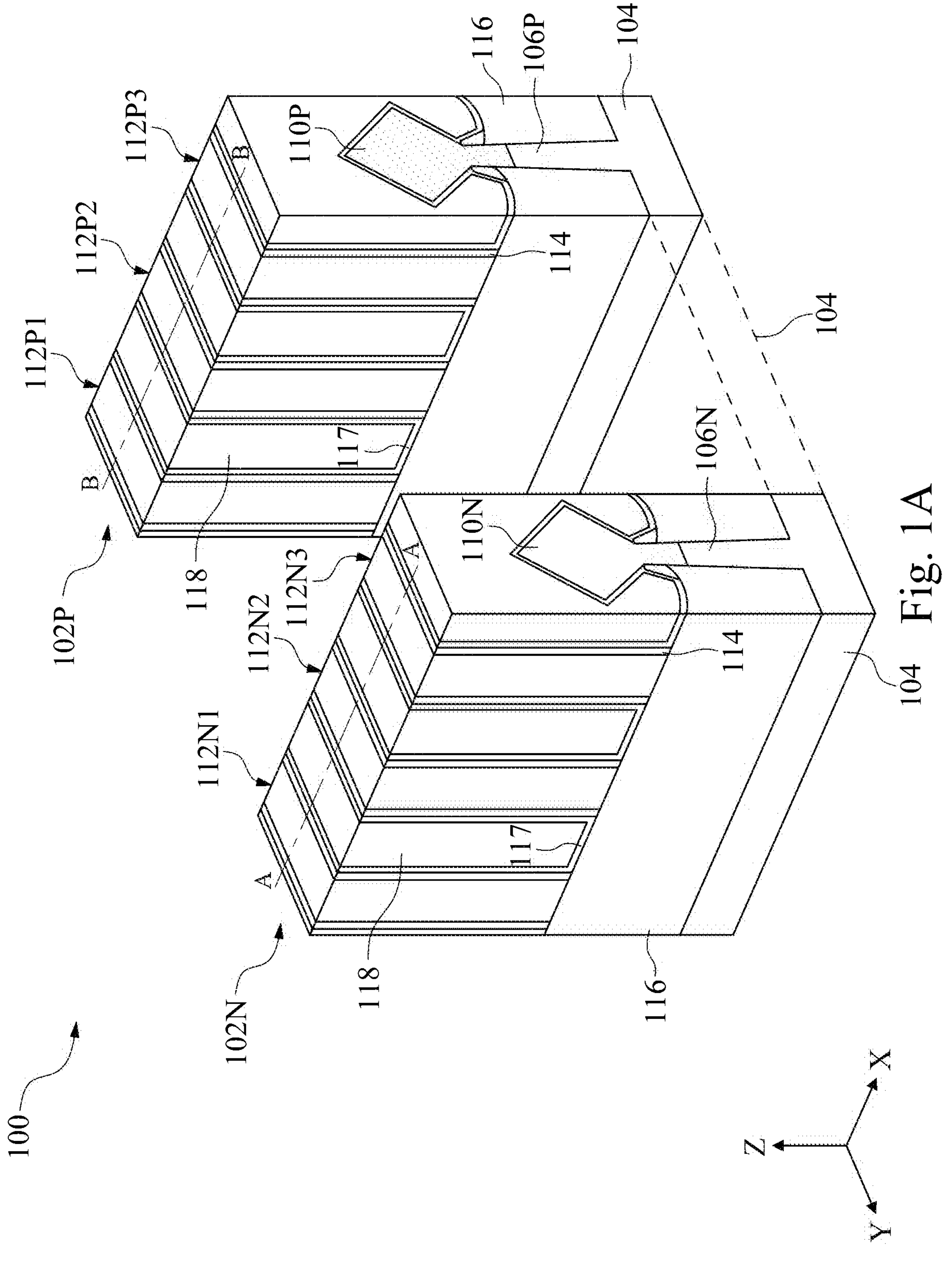
FIG. 1A illustrates an isometric view of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as “beneath,” “below,” “lower,” “above,” “upper,” and the like may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to “one embodiment,” “an embodiment,” “an example embodiment,” “exemplary,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms “about” and “substantially” can indicate a value of a given quantity that varies within 5% of the value (e.g., ±1%, ±2%, ±3%, ±4%, ±5% of the value). These values are merely examples and are not intended to be limiting. The terms “about” and “substantially” can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The GAA transistor structures may be patterned by any suitable method. For example, the structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structure.

GAA FETs can include fin or sheet bases disposed on a substrate, stacks of nanostructured channel regions disposed on the fin or sheet bases, and gate structures surrounding each of the nanostructured channel regions. The gate voltage—the threshold voltage (Vt)—to turn on a GAA FET can depend on the semiconductor material of the nanostructured channel regions and/or the effective work function (EWF) value of the gate structures of the GAA FET. For example, for an n-type GAA FET ("NFET"), reducing the difference between the EWF value of the NFET gate structure and the conduction band energy of the material (e.g., 4.1 eV for silicon (Si) or 3.8 eV for silicon germanium (SiGe)) of the NFET nanostructured channel regions can reduce the NFET threshold voltage. For a p-type GAA FET ("PFET"), reducing the difference between the EWF value of the PFET gate structure and the valence band energy of the material (e.g., 5.2 eV for Si or 4.8 eV for SiGe) of the PFET nanostructured channel regions can reduce the PFET threshold voltage. The EWF values of the gate structures can depend on the thickness and/or material composition of each of the layers of the gate structure. As such, GAA FETs can be manufactured with different threshold voltages by adjusting the thickness and/or material composition of the gate structures.

Due to the increasing demand for multi-functional low power portable devices, there is an increasing demand for GAA FETs with low threshold voltages, such as threshold voltages between about 200 mV and about 400 mV (referred to as "low threshold voltage"), threshold voltages between about 100 mV and about 200 mV (referred to as "ultra-low threshold voltage"), and threshold voltages below about 100 mV (referred to as "extreme-low threshold voltage"). One way to achieve multi-Vt devices with low, ultra-low, and/or extreme-low threshold voltages in GAA FETs can be with different work function metal (WFM) layer thicknesses greater than about 4 nm (e.g., about 5 nm to about 10 nm) in the gate structures. However, the different WFM layer thicknesses can be constrained by the GAA FET gate structure geometries. For example, the thicknesses of the WFM layers can be constrained by the spacing between the nanostructured channel regions of the GAA FETs. And, depositing different WFM layer thicknesses can become increasingly challenging with the continuous scaling down of GAA FETs.

To address the abovementioned challenges, the present disclosure provides example GAA FETs with different gate structures configured to provide different threshold voltages, and example methods of forming such multi-Vt GAA FETs on the same substrate. The example methods form NFETs and PFETs with WFM layers of the same material and of substantially equal thicknesses, and with extreme-low, ultra-low, and/or low threshold voltages, on the same substrate. These example methods can be more cost-effective (e.g., reduce cost by about 20% to about 30%) and time-efficient (e.g., reduce time by about 15% to about 20%) in manufacturing reliable GAA FET gate structures with different threshold voltages than other methods of forming GAA FETs with similar dimensions and threshold voltages on the same substrate. In addition, these example methods can form GAA FET gate structures with much smaller dimensions (e.g., thinner gate stacks) than other methods of forming GAA FETs with similar threshold voltages.

In some embodiments, NFETs and PFETs with different gate structure configurations, but with WFM layers of the same material and of substantially equal thicknesses can be formed on the same substrate to achieve different threshold voltages. The different gate structures can have high-K (HK) gate dielectric layers doped with metal dopants of different types and/or concentrations. The different types and/or concentrations of metal dopants can induce dipoles of different polarities and/or concentrations at interfaces between the HK gate dielectric layers and interfacial oxide (IL) layers ("HK-IL interfaces"). The dipoles of different polarities and/or concentrations result in gate structures with different EWF values. Since EWF values of gate structures correspond to threshold voltage of NFETs and PFETs, gate structures with different EWF values result in NFETs and PFETs with different threshold voltages on the same substrate. Thus, controlling the types and/or concentrations of metal dopants in the HK gate dielectric layers can tune the EWF values of the NFET and PFET gate structures, and as a result can adjust the threshold voltages of the NFETs and PFETs without varying the WFM layer thicknesses. And, forming the NFET and PFET gate structures with WFM layers of the same material can reduce the number of fabrication steps and as a result, reduce device manufacturing cost compared to NFET and PFET gate structures formed with WFM layers of different materials.

In some embodiments, both the NFET and PFET gate structures can be formed with n-type WFM ("nWFM") layers or p-type WFM ("pWFM") layers. The nWFM layers can include a metal or a metal-containing material with a work function value closer to a conduction band energy than a valence band energy of a material of the nanostructured channel regions of the NFETs and PFETs. In some embodiments, the nWFM layers can have a work function value less than about 4.5 eV. The pWFM layers can include a metal or a metal-containing material with a work function value closer to a valence band energy than a conduction band energy of a material of the nanostructured channel regions of the NFETs and PFETs. In some embodiments, the pWFM layers can have a work function value equal to or greater than about 4.5 eV.

In some embodiments, when both the NFET and PFET gate structures are formed with pWFM layers in addition to the dipoles at the HK-IL interfaces, the PFETs can be formed to have extreme-low, ultra-low, and/or low threshold voltages. However, additional dipoles of adequate polarity and concentration are formed at interfaces between the IL layers and the nanostructured channel regions ("IL-channel interfaces") of the NFETs to form the NFETs with extreme-low, ultra-low, and/or low threshold voltages. These additional dipoles can be formed by doping the NFET IL layers with metal dopants of adequate concentrations. In some embodiments, the metal dopants can include lutetium (Lu), scandium (Sc), yttrium (Y), thulium (Tm), or gadolinium (Gd). This additional doping of the NFET IL layers are performed because the work function value of the pWFM layers does not adequately reduce the difference between the EWF value of the NFET gate structures and the conduction band energy of the material of the NFET nanostructured channel regions in order to form the NFETs with extreme-low, ultra-low, and/or low threshold voltages.

On the other hand, in some embodiments, when both the NFET and PFET gate structures are formed with nWFM layers in addition to the dipoles at the HK-IL interfaces, the NFET can be formed to have extreme-low, ultra-low, and/or low threshold voltages. However, additional dipoles of adequate polarity and concentration can be formed at IL-channel interfaces of the PFETs to form the PFETs with extreme-low, ultra-low, and/or low threshold voltages. These additional dipoles can be formed by doping the PFET IL layers with metal dopants of adequate concentrations. This additional doping of the PFET IL layers are performed because the work function value of the nWFM layers does not adequately reduce the difference between the EWF value of the PFET gate structures and the valence band energy of the material of the PFET nanostructured channel regions in order to form the PFET gate structures with extreme-low, ultra-low, and/or low threshold voltages. In some embodiments, the metal dopants can include germanium (Ge), zinc (Zn), antimony (Sb), or tungsten (W).

Figure 1B:
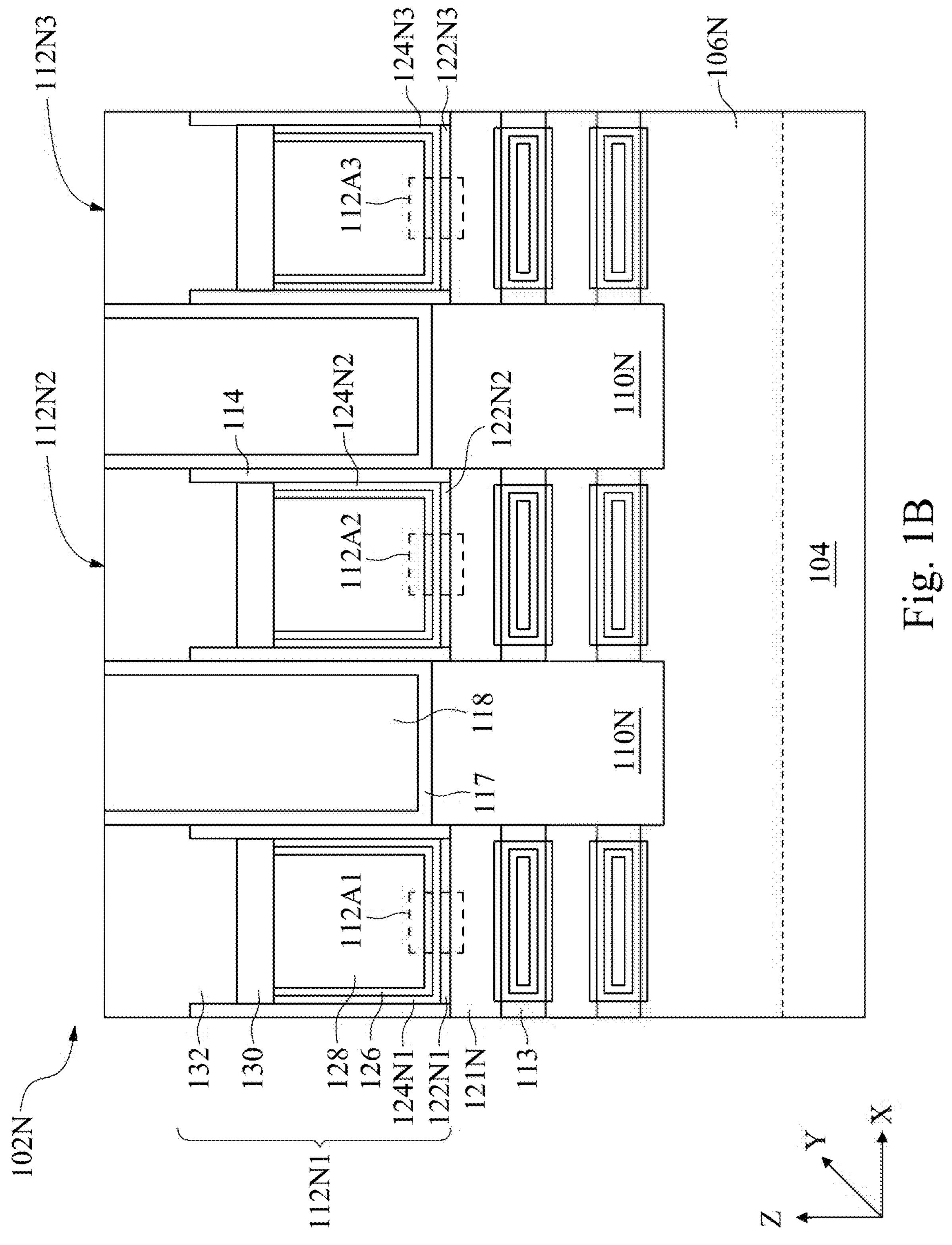
FIGS. 1B-1G illustrate cross-sectional views of a semiconductor device with different gate structures, in accordance with some embodiments.
Figure 1C:
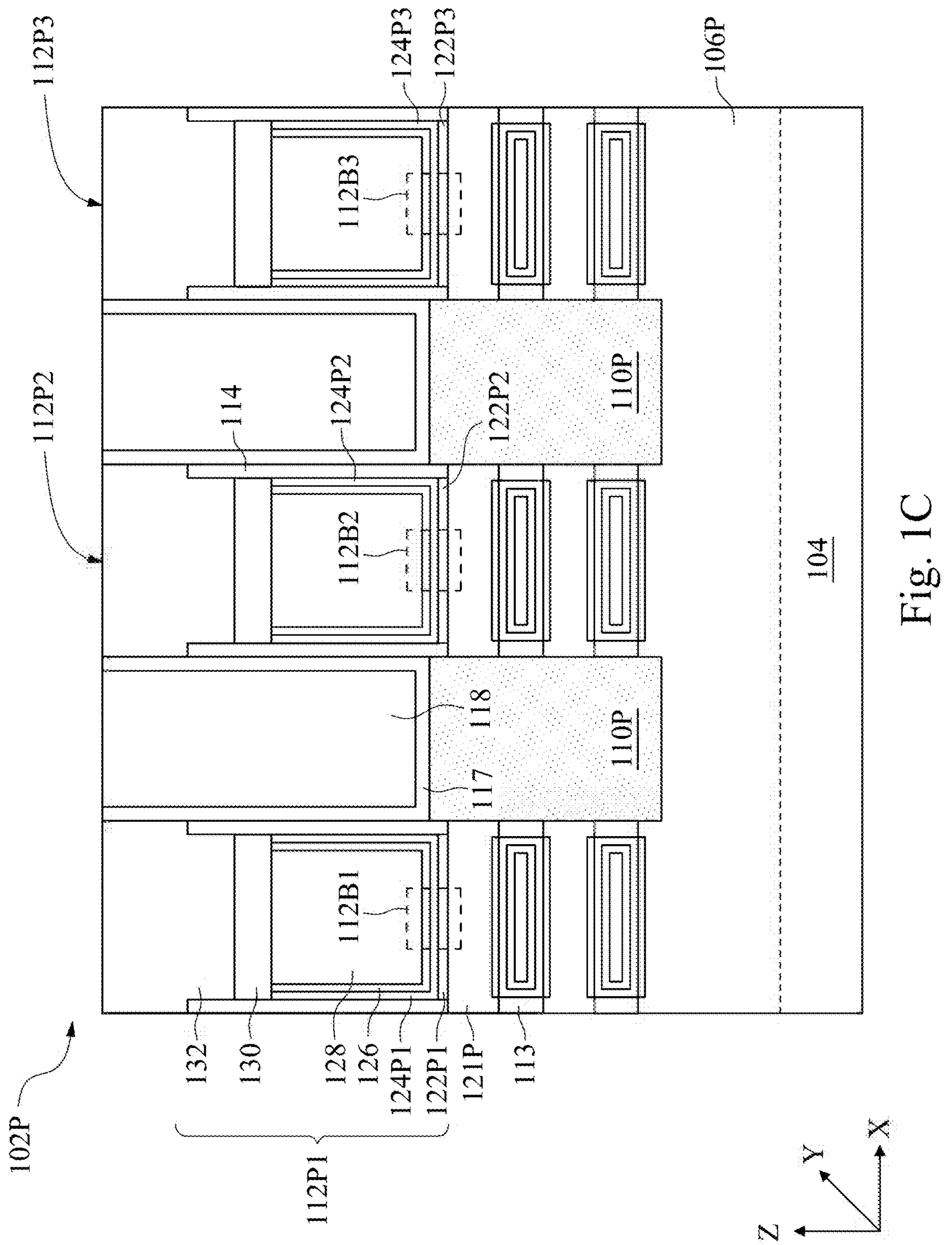
Figures 1D, 1E:
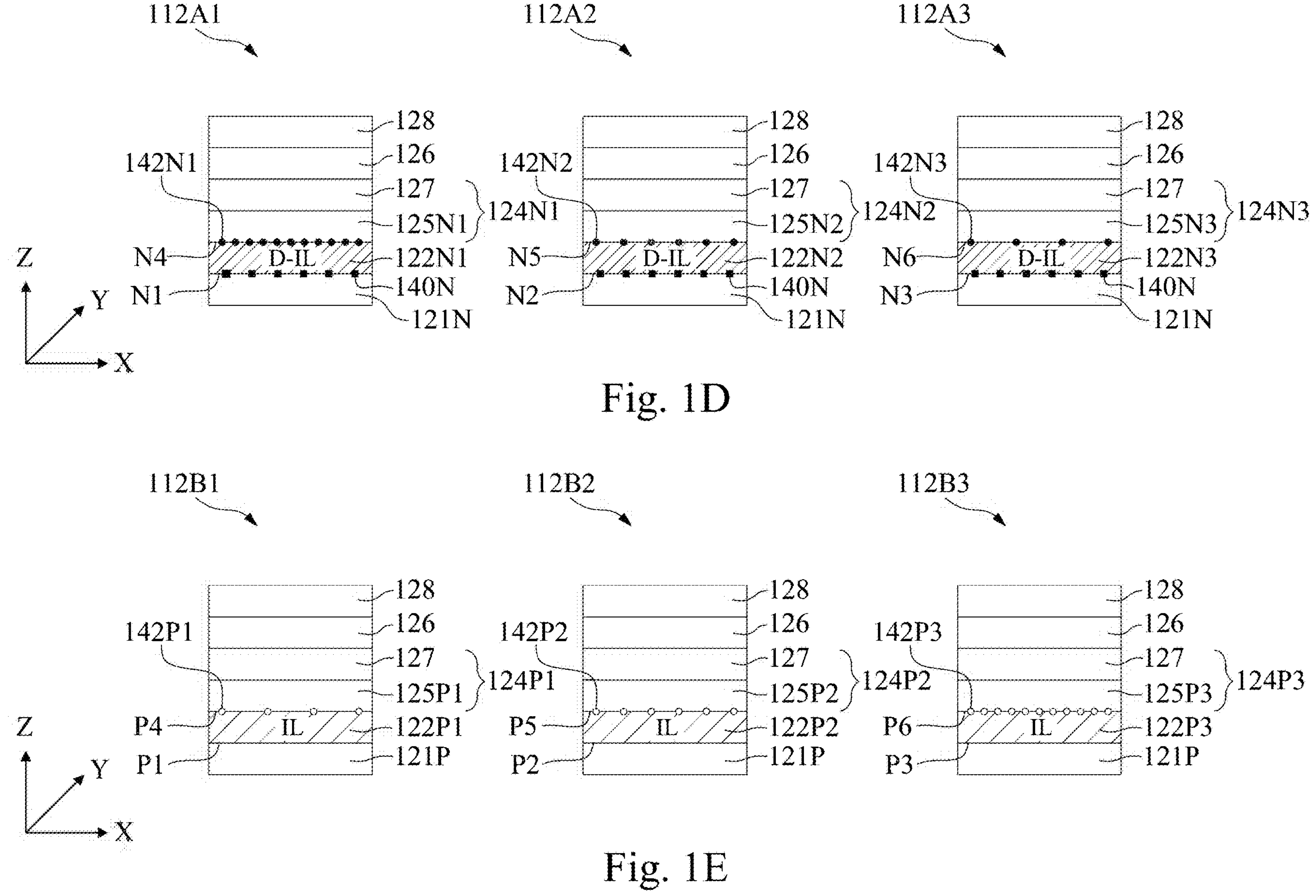
Figures 1F, 1G:
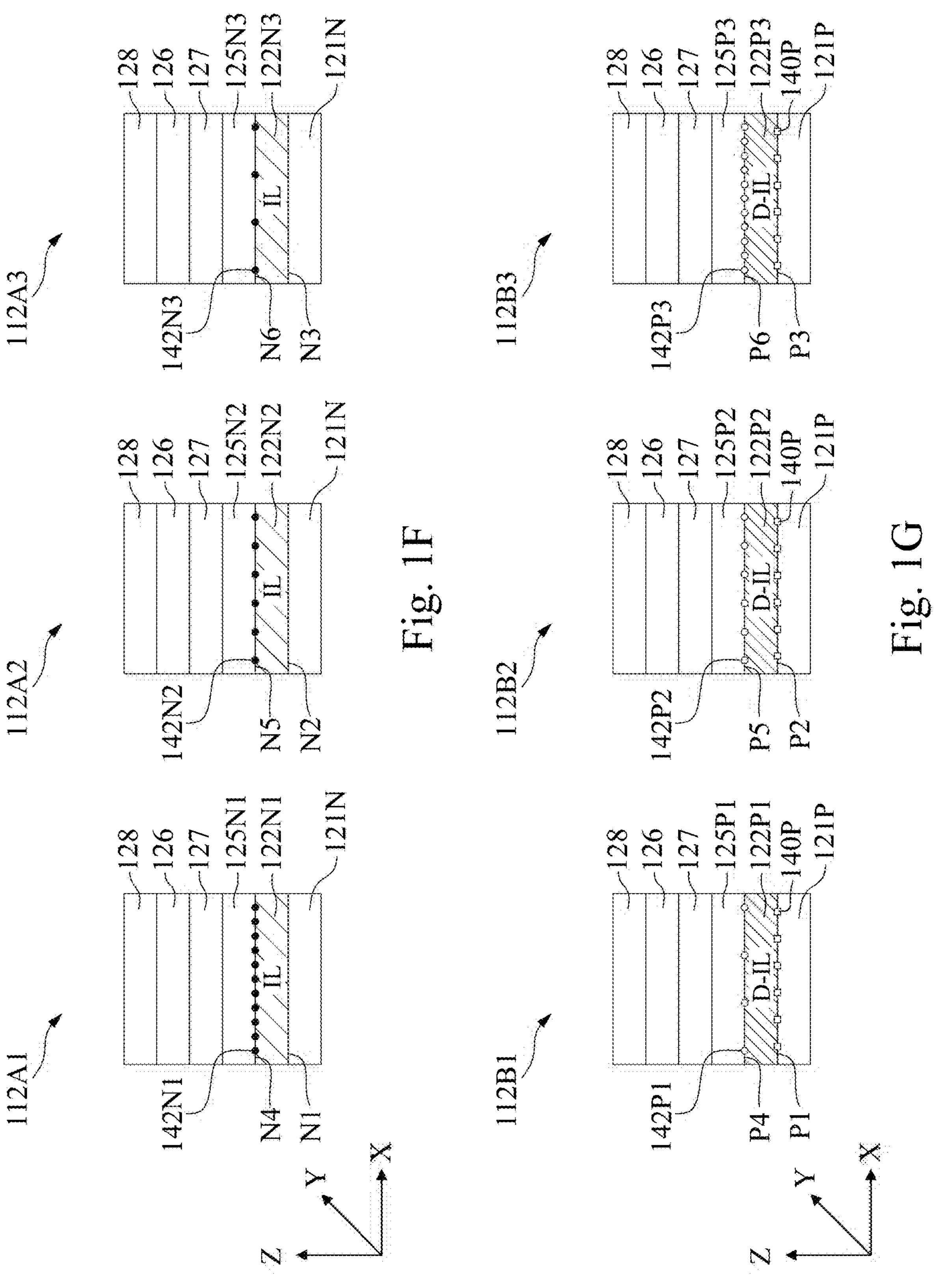

FIG. 1A illustrates an isometric view of a semiconductor device 100 with an n-type GAA FET 102N ("NFET 102N") and a p-type GAA FET 102P ("PFET 102P"), according to some embodiments. FIG. 1B illustrates a cross-sectional view of NFET 102N along line A-A of FIG. 1, according to some embodiments. FIG. 1C illustrates a cross-sectional views of PFET 102P along line B-B of FIG. 1, according to some embodiments. FIGS. 1B and 1C illustrate cross-sectional views of semiconductor device 100 with additional structures that are not shown in FIG. 1A for simplicity. FIGS. 1D and 1F are enlarged views of regions 112A1, 112A2, and 112A3 of FIG. 1B and illustrate different cross-sectional views of regions 112A1, 112A2, and 112A3. FIGS. 1E and 1G are enlarged views of regions 112B1, 112B2, and 112B3 of FIG. 1C and illustrate different cross-sectional views of regions 112B1, 112B2, and 112B3. FIGS. 1D, 1E, 1F, and 1G illustrate additional structures that are not shown in FIGS. 1B and 1C for simplicity. The discussion of elements with the same annotations applies to each other, unless mentioned otherwise.

Referring to FIGS. 1A-1C, in some embodiments, semiconductor device 100 can be formed on a substrate 104 with NFET 102N and PFET 102P formed on different regions of substrate 104. There may be other FETs and/or structures (e.g., isolation structures) formed between NFET 102N and PFET 102P on substrate 104. Substrate 104 can be a semiconductor material, such as Si, germanium (Ge), SiGe, a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). Semiconductor device 100 can further include gate spacers 114, shallow trench isolation (STI) regions 116, etch stop layers (ESLs) 117, and interlayer dielectric (ILD) layers 118. In some embodiments, gate spacers 114, STI regions 116, ESLs 117, and ILD layers 118 can include an insulating material, such as silicon oxide ($SiO_2$), silicon nitride (SiN), silicon carbon nitride (SiCN), silicon oxycarbon nitride (SiOCN), and silicon germanium oxide.

Referring to FIGS. 1A and 1B, in some embodiments, NFET 102N can include (i) a fin or sheet base 106N, (ii) source/drain (S/D) regions 110N disposed on fin or sheet base 106N, (iii) gate structures 112N1-112N3 disposed on portions of fin or sheet base 106N that are not covered by S/D regions 110N, and (iv) nanostructured channel regions 121N surrounded by gate structures 112N1-112N3. Referring to FIGS. 1A and 1C, in some embodiments, PFET 102P can include (i) a fin or sheet base 106P, (ii) source/drain (S/D) regions 110P disposed on fin or sheet base 106P, (iii) gate structures 112P1-112P3 disposed on portions of fin or sheet base 106P that are not covered by S/D regions 110P, and (iv) nanostructured channel regions 121P surrounded by gate structures 112P1-112P3. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 121 can be in the form of nanosheets, nanowires, nanorods, nanotubes, or other suitable nanostructured shapes. In some embodiments, fin or sheet bases 106N and 106P can include a material similar to substrate 104 and extend along an X-axis.

In some embodiments, S/D regions 110N can include an epitaxially-grown semiconductor material, such as Si, and n-type dopants, such as phosphorus and other suitable n-type dopants. In some embodiments, S/D regions 110P can include an epitaxially-grown semiconductor material, such as Si and SiGe, and p-type dopants, such as boron and other suitable p-type dopants.

In some embodiments, nanostructured channel regions 121N and 121P can include semiconductor materials similar to or different from substrate 104. In some embodiments, nanostructured channel regions 121N and 121P can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121N and 121P are shown, nanostructured channel regions 121N and 121P can have cross-sections of other geometric shapes (e.g., circular, elliptical, triangular, or polygonal). In some embodiments, nanostructured channel regions 121N and 121P can be separated from each other along a Z-axis by a distance of about 8 nm to about 12 nm. In some embodiments, each of nanostructured channel regions 121N and 121P can have a thickness of about 5 nm to about 8 nm along a Z-axis. In some embodiments, each of nanostructured channel regions 121N and 121P can have a width of about 15 nm to about 50 nm along an X-axis.

In some embodiments, the portions of gate structures 112N1-112N3 surrounding nanostructured channel regions 121N can be electrically isolated from adjacent S/D regions 110N by inner spacers 113. Similarly, the portions of gate structures 112P1-112P3 surrounding nanostructured channel regions 121P can be electrically isolated from adjacent S/D regions 110P by inner spacers 113. Inner spacers 113 can include a material similar to gate spacers 114. In some embodiments, NFET 102N and PFET 102P can be finFETs and have fin regions (not shown) instead of nanostructured channel regions 121N and 121P.

In some embodiments, gate structures 112N1-112N3 and 112P1-112P3 can be multi-layered structures. In some embodiments, gate structures 112N1-112N3 can include (i) IL layers 122N1-122N3, respectively, (ii) HK gate dielectric layers 124N1-124N3 disposed on IL layers 122N1-122N3, respectively, (iii) WFM layers 126 disposed on HK gate dielectric layers 124N1-124N3, (iv) gate metal fill layers 128 disposed on WFM layers 126, (v) conductive capping layers 130 disposed on HK gate dielectric layers 124N1-124N3, WFM layers 126, and gate metal fill layers 128, and (vi) insulating capping layers 132 disposed on conductive capping layers 130.

Similarly, in some embodiments, gate structures 112P1-112P3 can include (i) IL layers 122P1-122P3, respectively, (ii) HK gate dielectric layers 124P1-124P3 disposed on IL layers 122P1-122P3, respectively, (iii) WFM layers 126 disposed on HK gate dielectric layers 124P1-124P3, (iv) gate metal fill layers 128 disposed on WFM layers 126, (v) conductive capping layers 130 disposed on HK gate dielectric layers 124P1-124P3, WFM layers 126, and gate metal fill layers 128, and (vi) insulating capping layers 132 disposed on conductive capping layers 130.

In some embodiments, gate metal fill layers 128 can include a suitable conductive material, such as W, titanium (Ti), silver (Ag), ruthenium (Ru), molybdenum (Mo), copper (Cu), cobalt (Co), aluminum (Al), iridium (Ir), nickel (Ni), metal alloys, and a combination thereof. Insulating capping layers 132 can protect the underlying conductive capping layers 130 from structural and/or compositional degradation during subsequent processing of the semiconductor device 100. In some embodiments, insulating capping layers 132 can include a nitride material, such as SiN, and can have a thickness of about 5 nm to about 10 nm for adequate protection of the underlying conductive capping layers 130. Conductive capping layers 130 can provide conductive interfaces between gate metal fill layers 128 and gate contact structures (not shown) to electrically connect gate metal fill layers 128 to gate contact structures without forming gate contact structures directly on or within gate metal fill layers 128. In some embodiments, conductive capping layers 130 can include a metallic material, such as W, Ru, Ir, Mo, and a combination thereof, or other suitable metallic materials.

In some embodiments, WFM layers 126 of gate structures 112N1-112N3 and 112P1-112P3 can include pWFM layers 126. In some embodiments, pWFM layers 126 can include substantially Al-free (e.g., with no Al) metals, metal nitrides, or metal alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), molybdenum nitride (MoN), and W. In some embodiments, WFM layers 126 of gate structures 112N1-112N3 and 112P1-112P3 can include nWFM layers 126. In some embodiments, nWFM layers 126 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or Mo.

As discussed above, based on the material of WFM layers, NFET or PFET gate structures can have metal dopants in IL layers and dipoles at IL-channel interfaces, which are further described with reference to FIGS. 1D, 1E, 1F, and 1G. FIGS. 1D and 1E illustrate metal dopant configurations in IL layers 122N1-122N3 and 122P1-122P3, and dipole configurations at IL-channel interfaces N1-N3 and P1-P3 for gate structures 112N1-112N3 and 112P1-112P3 having pWFM layers 126. FIGS. 2F and 1G illustrate metal dopant configurations in IL layers 122N1-122N3 and 122P1-122P3, and dipole configurations at IL-channel interfaces N1-N3 and P1-P3 for gate structures 112N1-112N3 and 112P1-112P3 having nWFM layers 126. In some embodiments, IL layers 122N1-122N3 and 122P1-122P3 can include $SiO_2$, silicon germanium oxide ($SiGeO_x$), or germanium oxide ($GeO_2$).

Referring to FIG. 1D, IL layers 122N1-122N3 can further include metal dopants that induce the formation of dipole layers 140N with n-type dipoles (N-dipoles) at IL-channel interfaces N1-N3. In some embodiments, dipole layers 140N can be disposed in IL layers 122N1-122N3 and closer to IL-channel interfaces N1-N3, instead of at IL-channel interfaces N1-N3. Each dipole layer 140N can provide a flat band voltage shift of about 300 mV to counteract the increase in threshold voltages of gate structures 112N1-112N3 due to pWFM layers 126, which can have a work function value equal to or greater than 4.5 eV. Such work function value of pWFM layers 126 can increase the difference between the EWF of gate structures 112N1-112N3 and the conduction band energy (e.g., 4.1 eV for Si or 3.8 eV for SiGe) of nanostructured channel regions 121N, thus increasing the threshold voltages of gate structures 112N1-112N3.

On the other hand, referring to FIG. 1E, the work function value of pWFM layers 126 can reduce the difference between the EWF of gate structures 112P1-112P3 and the valence band energy (e.g., 5.2 eV for Si or 4.8 eV for SiGe) of nanostructured channel regions 121P, thus reducing the threshold voltages of gate structures 112P1-112P3. Thus, gate structures 112P1-112P3 do not include metal dopants in IL layers 122P1-122P3 and dipoles at IL-channel interfaces P1-P3.

Figure 1H:
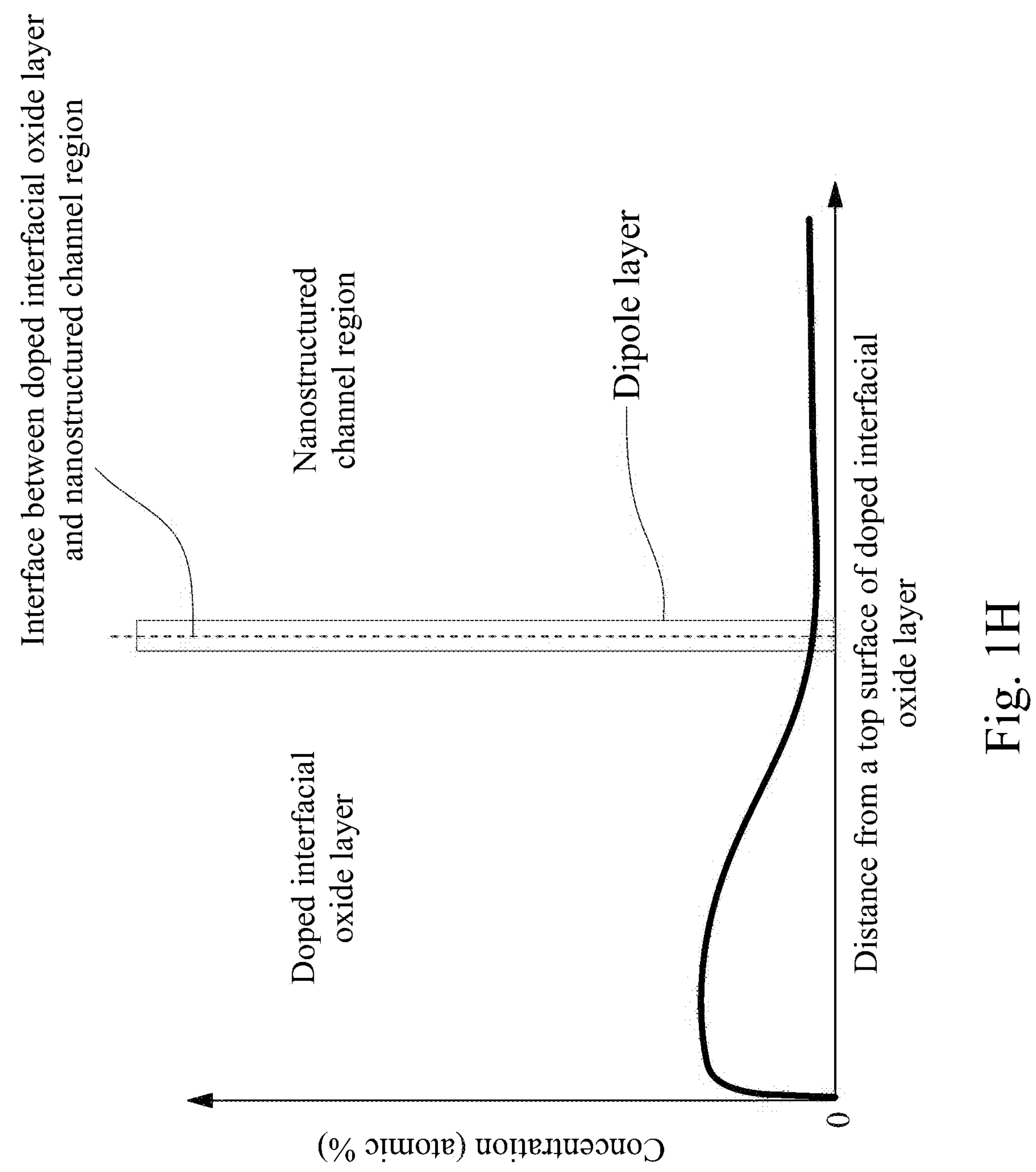
FIGS. 1H and 1I illustrate device characteristics of a semiconductor device with different gate structures, in accordance with some embodiments.

Referring to FIG. 1D, in some embodiments, the concentration of N-dipoles of dipoles layers 140N in IL layers 122N1-122N3 can be substantially equal to each other. In some embodiments, N-dipoles of dipoles layers 140N can include metal ions from the metal dopants in IL layers 122N1-122N3 and oxygen ions from the oxide material of IL layer 122N1-122N3. The metal dopants in IL layers 122N1-122N3 can include a metal with a lower electronegativity than that of a metal (e.g., hafnium (Hf), zirconium (Zr)) in HK gate dielectric layers 124N1-124N3. In some embodiments, the metal dopants in IL layers 122N1-122N3 can include La, Lu, Sc, Y, Tm, or Gd. In some embodiments, the metal dopants in IL layers 122N1-122N3 can be of the same metal with concentrations substantially equal to each other to induce N-dipoles in dipole layers 140N of the same type and with concentrations substantially equal to each other. In some embodiments, the metal dopants can have a dopant concentration profile across IL layers 122N1-122N3 along a Z-axis, as shown in FIG. 1H. The peak concentration of the metal dopants in IL layers 122N1-122N3 can be closer to top surfaces of IL layers 122N1-122N3, as shown in FIG. 1H.

Referring to FIG. 1G, IL layers 122P1-122P3 can further include metal dopants that induce the formation of dipole layers 140P with p-type dipoles (P-dipoles) at IL-channel interfaces P1-P3. In some embodiments, dipole layers 140P can be disposed in IL layers 122P1-122P3 and closer to IL-channel interfaces P1-P3, instead of at IL-channel interfaces P1-P3. Each dipole layer 140P can provide a flat band voltage shift of about 300 mV to counteract the increase in threshold voltages of gate structures 112P1-112P3 due to nWFM layers 126, which can have a work function value less than 4.5 eV. Such work function value of nWFM layers 126 can increase the difference between the EWF of gate structures 112P1-112P3 and the valence band energy (e.g., 5.2 eV for Si or 4.8 eV for SiGe) of nanostructured channel regions 121P, thus increasing the threshold voltages of gate structures 112P1-112P3.

On the other hand, referring to FIG. 1F, the work function value of nWFM layers 126 can reduce the difference between the EWF of gate structures 112N1-112N3 and the conduction band energy (e.g., 4.1 eV for Si or 3.8 eV for SiGe) of nanostructured channel regions 121N, thus reducing the threshold voltages of gate structures 112N1-112N3. Thus, gate structures 112N1-112N3 do not include metal dopants in IL layers 122N1-122N3 and dipoles at IL-channel interfaces N1-N3.

Referring to FIG. 1G, in some embodiments, the concentration of P-dipoles of dipoles layers 140P in IL layers 122P1-122P3 can be substantially equal to each other. In some embodiments, P-dipoles of dipoles layers 140P can include metal ions from the metal dopants in IL layers 122P1-122P3 and oxygen ions from the oxide material of IL layer 122P1-122P3. The metal dopants in IL layers 122P1-

122P3 can include a metal with a higher electronegativity than that of a metal (e.g., Hf, Zr) in HK gate dielectric layers 124P1-124P3. In some embodiments, the metal dopants in IL layers 122P1-122P3 can include Ge, Zn, Sb, or W. In some embodiments, the metal dopants in IL layers 122P1-122P3 can be of the same metal and with concentrations substantially equal to each other to induce P-dipoles in dipole layers 140P of the same type with concentrations substantially equal to each other. In some embodiments, the metal dopants can have a dopant concentration profile across IL layers 122P1-122P3 along a Z-axis, as shown in FIG. 1H. The peak concentration of the metal dopants in IL layers 122P1-122P3 can be closer to top surfaces of IL layers 122P1-122P3, as shown in FIG. 1H.

Referring to FIGS. 1B-1G, in some embodiments, HK gate dielectric layers 124N1-124N3 and 124P1-124P3 can include (i) doped HK gate dielectric layer 125N1-125N3 and 125P1-125P3, and (ii) undoped HK gate dielectric layers 127 disposed on doped HK gate dielectric layer 125N1-125N3 and 125P1-125P3. In some embodiments, doped HK gate dielectric layer 125N1-125N3 and 125P1-125P3 and undoped HK gate dielectric layers 127 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$).

Referring to FIGS. 1D and 1F, doped HK gate dielectric layers 125N1-125N3 can further include metal dopants that induce the formation of dipole layers 142N1-142N3 with N-dipoles at HK-IL interfaces N4-N6. In some embodiments, dipole layers 142N1-142N3 can be disposed in doped HK gate dielectric layer 125N1-125N3 and closer to HK-IL interfaces N4-N6, instead of at HK-IL interfaces N4-N6. In some embodiments, the metal dopants in doped HK gate dielectric layer 125N1-125N3 can include rare-earth metals (REMs), such as lanthanum (La), yttrium (Y), cerium (Ce), ytterbium (Yb), and erbium (Er). In some embodiments, N-dipoles of dipole layers 142N1-142N3 can include metal ions from metal dopants in doped HK gate dielectric layers 125N1-125N3 and oxygen ions from the high-K material of doped HK gate dielectric layers 125N1-125N3.

Figure 1I:
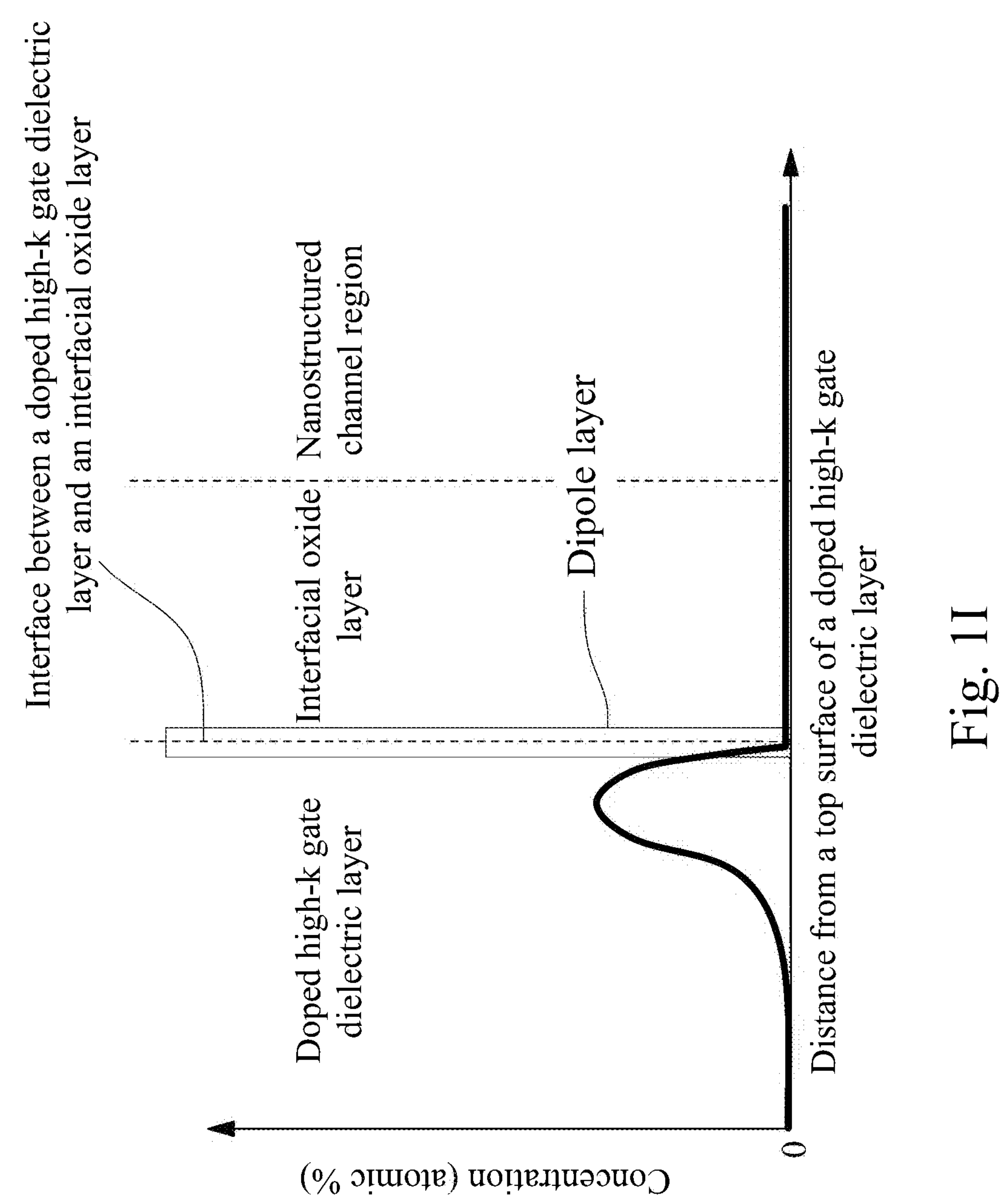

In some embodiments, doped HK gate dielectric layer 125N1-125N3 can include metal dopants of the same metal, but with concentrations different from each other to induce N-dipoles in dipole layers 142N1-142N3 of the same type and with concentrations different from each other. As metal dopant concentration is directly proportional to N-dipole concentration, which is inversely proportional to threshold voltage of an NFET gate structure, (i) doped HK gate dielectric layer 125N1 has a higher concentration of metal dopants than that in doped HK gate dielectric layers 125N2 and 125N3 to form gate structure 112N1 with a threshold voltage smaller than that of gate structures 112N2 and 112N3, and (ii) doped HK gate dielectric layer 125N2 has a higher concentration of metal dopants than that in doped HK gate dielectric layer 125N3 to form gate structure 112N2 with a threshold voltage smaller than that of gate structure 112N3. Thus, threshold voltages across different NFET gate structures (e.g., gate structures 112N1-112N3) on the same substrate can be varied with different concentrations of the same polarity dipoles (e.g., N-dipoles). In some embodiments, the metal dopants in doped HK gate dielectric layer 125N1-125N3 can have a dopant concentration profile across doped HK gate dielectric layer 125N1-125N3 along a Z-axis, as shown in FIG. 1I. The peak concentration of the metal dopants in doped HK gate dielectric layer 125N1-125N3 can be closer to HK-IL interfaces N4-N6, as shown in FIG. 1I.

Referring to FIGS. 1E and 1G, doped HK gate dielectric layers 125P1-125P3 can further include metal dopants that induce the formation of dipole layers 142P1-142P3 with P-dipoles at HK-IL interfaces P4-P6. In some embodiments, dipole layers 142P1-142P3 can be disposed in doped HK gate dielectric layer 125P1-125P3 and closer to HK-IL interfaces P4-P6, instead of at HK-IL interfaces P4-P6. In some embodiments, the metal dopants in doped HK gate dielectric layer 125P1-125P3 can include Zn, Ge, Al, Ti, or vanadium (V). In some embodiments, P-dipoles of dipole layers 142P1-142P3 can include metal ions from metal dopants in doped HK gate dielectric layers 125P1-125P3 and oxygen ions from the high-K material of doped HK gate dielectric layers 125P1-125P3.

In some embodiments, doped HK gate dielectric layer 125P1-125P3 can include metal dopants of the same metal, but with concentrations different from each other to induce P-dipoles in dipole layers 142P1-142P3 of the same type and with concentrations different from each other. As metal dopant concentration is directly proportional to P-dipole concentration, which is inversely proportional to threshold voltage of an PFET gate structure, (i) doped HK gate dielectric layer 125P3 has a higher concentration of metal dopants than that in doped HK gate dielectric layers 125P1 and 125P2 to form gate structure 112P3 with a threshold voltage smaller than that of gate structures 112P1 and 112P2, and (ii) doped HK gate dielectric layer 125P2 has a higher concentration of metal dopants than that in doped HK gate dielectric layer 125P1 to form gate structure 112P2 with a threshold voltage smaller than that of gate structure 112P1. Thus, threshold voltages across different PFET gate structures (e.g., gate structures 112P1-112P3) on the same substrate can be varied with different concentrations of the same polarity dipoles (e.g., P-dipoles). In some embodiments, the metal dopants in doped HK gate dielectric layer 125P1-125P3 can have a dopant concentration profile doped HK gate dielectric layer 125P1-125P3, as shown in FIG. 1I. The peak concentration of the metal dopants in doped HK gate dielectric layer 125P1-125P3 can be closer to HK-IL interfaces P4-P6, as shown in FIG. 1I.

In some embodiments, IL layers 122N1-122N3 and 122P1-122P3 can have a thickness of about 0.5 nm to about 1 nm and HK gate dielectric layers 124N1-124N3 and 124P1-124P3 can have a thickness of about 1.5 nm to about 4 nm. Within these thickness ranges of IL layers 122N1-122N3 and 122P1-122P3 and HK gate dielectric layers 124N1-124N3 and 124P1-124P3, adequate electrical isolation between nanostructures channel regions 121N and gate structures 112N1-112N3 and between nanostructures channel regions 121P and gate structures 112P1-112P3 can be provided without compromising device size and manufacturing cost.

Figure 2:
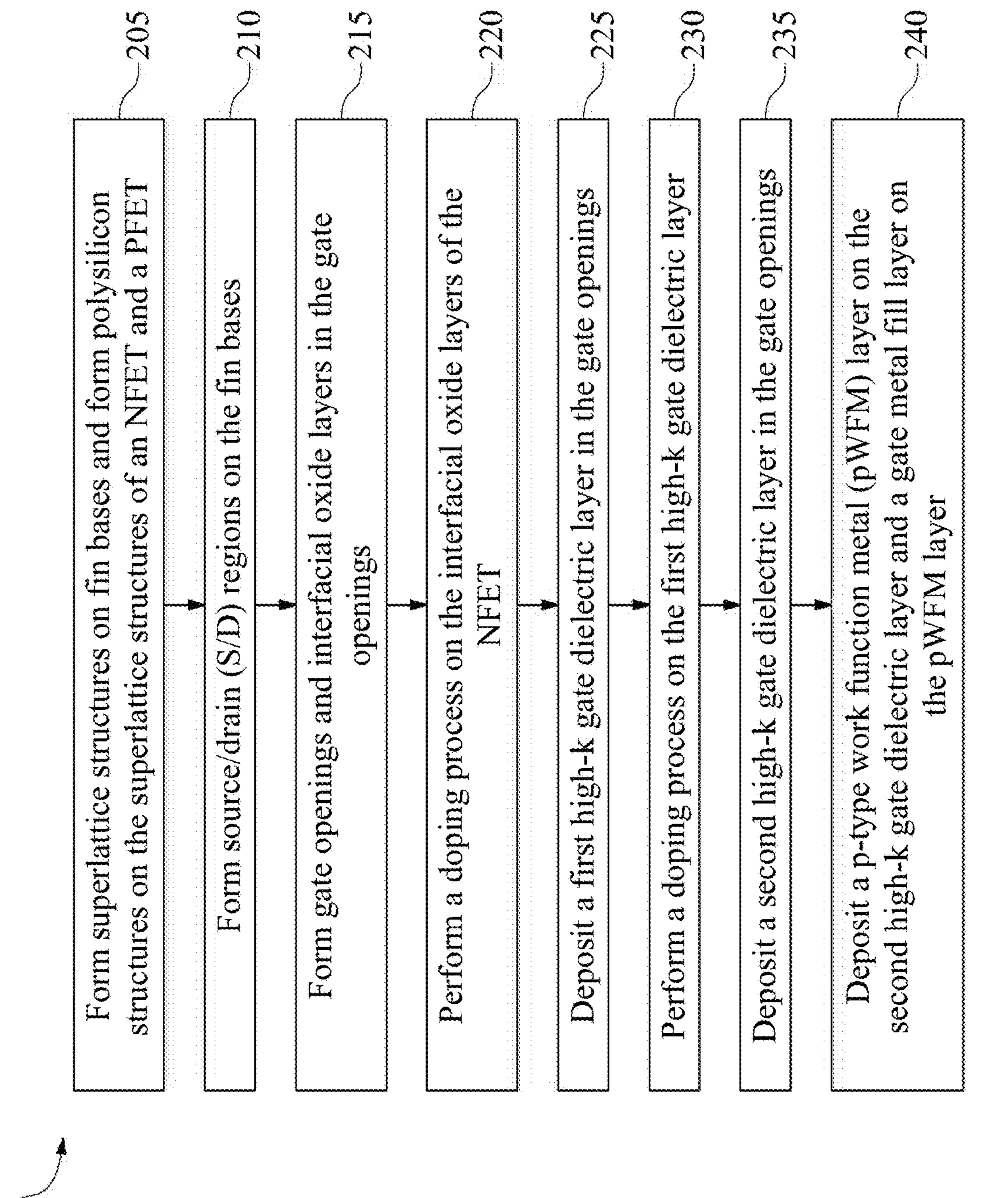
FIG. 2 is a flow diagram of a method for fabricating a semiconductor device with different gate structures, in accordance with some embodiments.

FIG. 2 is a flow diagram of an example method 200 for fabricating NFET 102N and PFET 102P with cross-sectional views shown in FIGS. 1B-1E, according to some embodiments. For illustrative purposes, the operations illustrated in FIG. 2 will be described with reference to the example fabrication process for fabricating NFET 102N and PFET 102P as illustrated in FIGS. 3A-22B. FIGS. 3A-22A are cross-sectional views of NFET 102N along line A-A of FIG. 1A, and FIGS. 3B-22B are cross-sectional views of PFET 102P along line B-B of FIG. 1A at various stages of fabrication, according to some embodiments. Operations can be performed in a different order or not performed depending on specific applications. It should be noted that method 200 may not produce a complete NFET 102N and PFET 102P. Accordingly, it is understood that additional processes can be provided before, during, and after method 200, and that some other processes may only be briefly described herein. Elements in FIGS. 3A-22B with the same annotations as elements in FIGS. 1A-1E are described above.

Referring to FIG. 2, in operation 205, superlattice structures are formed on fin or sheet bases, and polysilicon structures are formed on the superlattice structures for an NFET and a PFET. For example, as described with reference to FIGS. 3A and 3B, superlattice structures 323N and 323P are formed on fin or sheet bases 106N and 106P, respectively, and polysilicon structures 312N and 312P are formed on superlattice structures 323N and 323P, respectively. Superlattice structures 323N can include nanostructured layers 121N and 321 arranged in an alternating configuration. Similarly, superlattice structures 323P can include nanostructured layers 121P and 321 arranged in an alternating configuration. In some embodiments, nanostructured layers 321 include materials different from nanostructured layers 121N and 121P. Nanostructured layers 321 are also referred to as "sacrificial layers 321." During subsequent processing, polysilicon structures 312N and 312P and sacrificial layers 321 can be replaced in a gate replacement process to form gate structures 112N1-112N3 and 112P1-112P3.

Figure 3A:
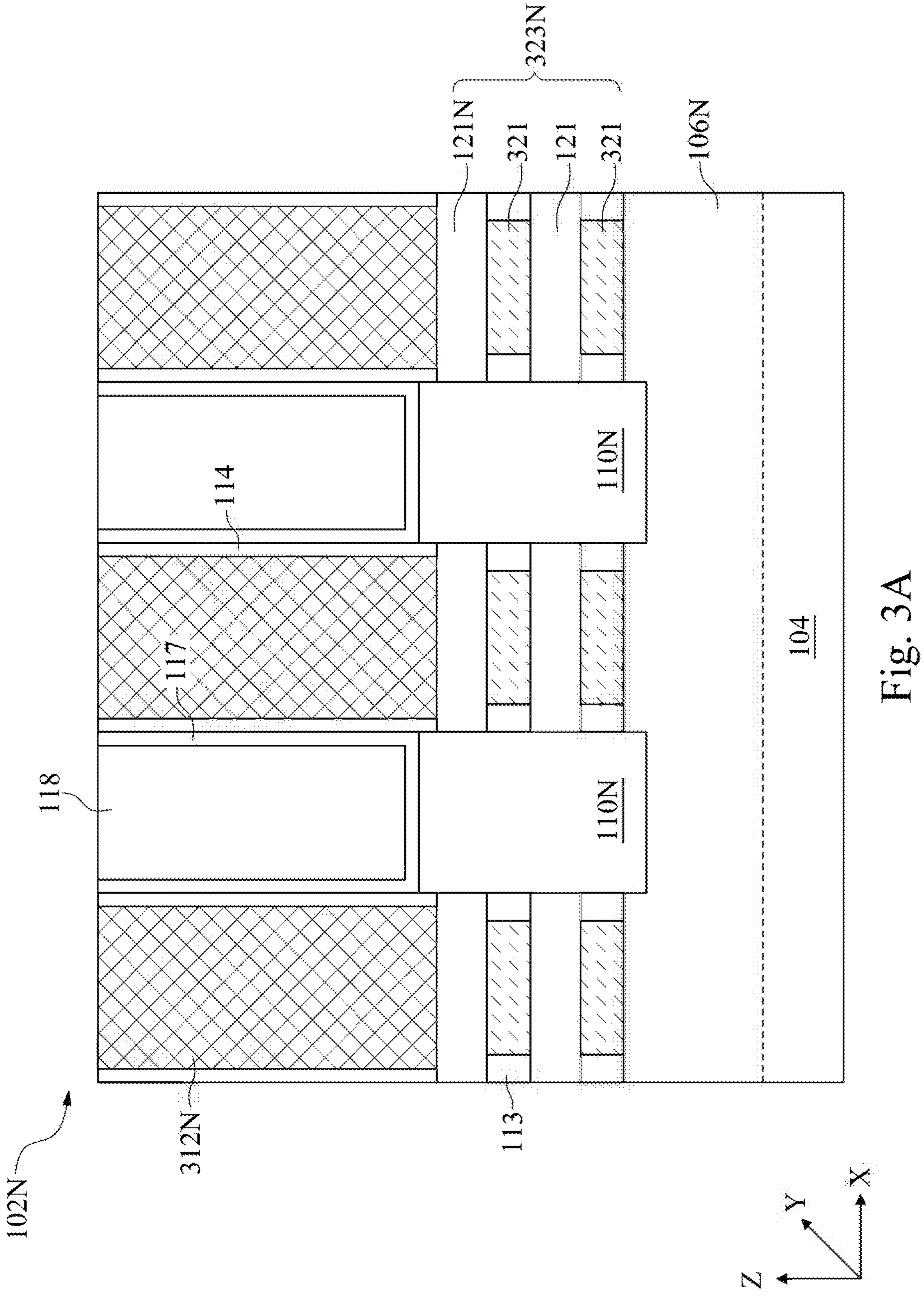
Figure 3B:
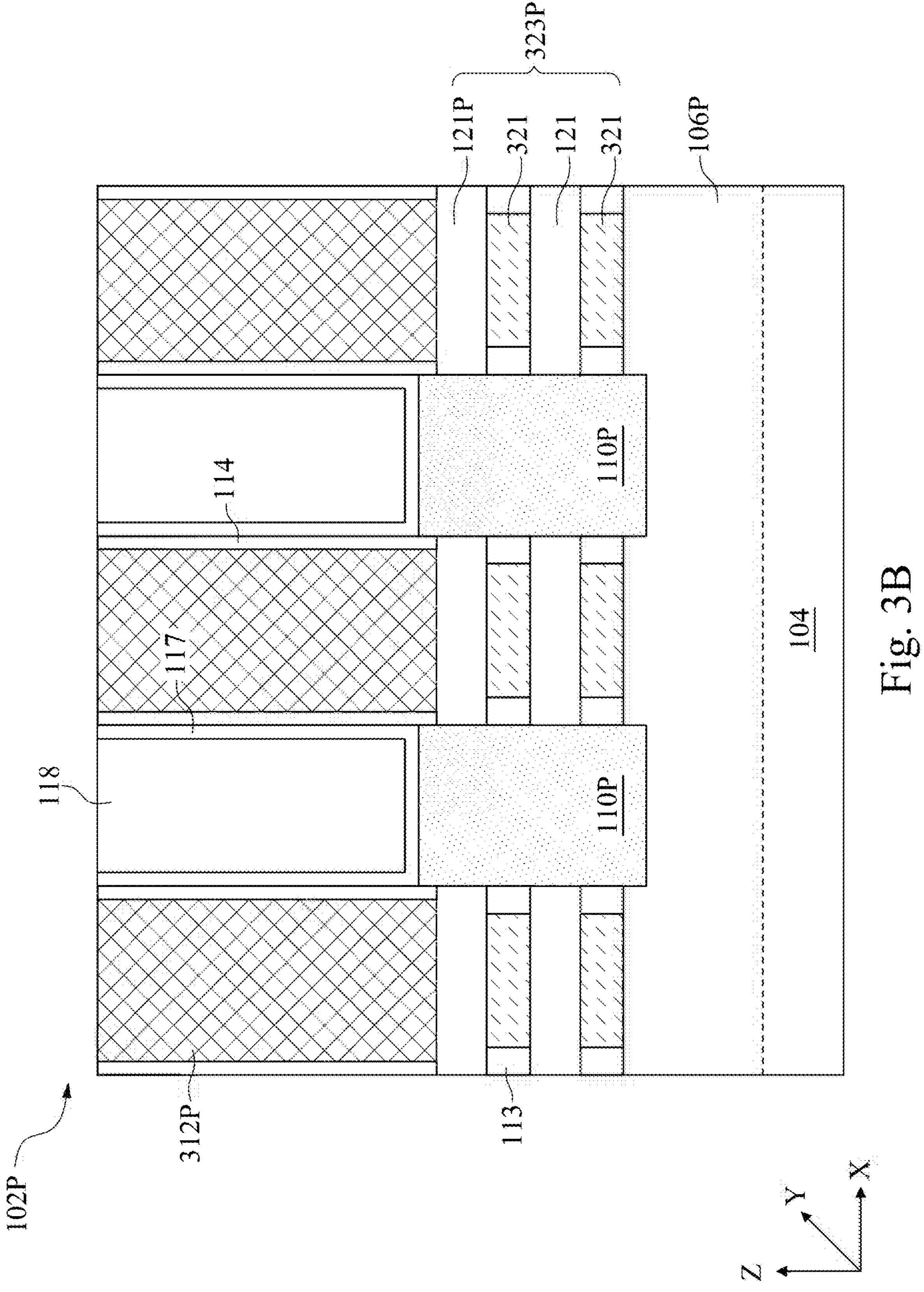

Referring to FIG. 2, in operation 210, S/D regions are formed on the fin or sheet bases. For example as described with reference to FIGS. 3A and 3B, S/D regions 110N and 110P are formed on fin structures 106N and 106P, respectively. In some embodiments, S/D regions 110N and 110P can be epitaxially grown on fin structures 106N and 106P. Prior to the formation of S/D regions 110N and 110P, inner spacers 113 can be formed in superlattice structures 323N and 323P, as shown in FIGS. 3A and 3B. After the formation of S/D regions 110N and 110P, ESL 117 and ILD layer 118 can be formed, as shown in FIGS. 3A and 3B.

Referring to FIG. 2, in operation 215, gate openings are formed and IL layers are formed in the gate openings. For example, as described with reference to FIGS. 4A and 4B, gate openings 412N1-412N3 and 412P1-412P3 and IL layers 422N1-422N3 and 122P1-122P3 are formed. Gate openings 412N1-412N3 and 412P1-412P3 can be formed by removing polysilicon structures 312N and 312P and sacrificial layers 321. IL layers 422N1-422N3 are formed in gate openings 412N1-412N3 and IL layers 122P1-122P3 are formed in gate openings 412P1-412P3. In some embodiments, IL layers 422N1-422N3 and 122P1-122P3 can be formed by performing a wet oxidation process on the exposed surfaces of nanostructured channel regions 121N and 121P and fin or sheet bases 106N and 106P in gate openings 412N1-412N3 and 412P1-412P3. The wet oxidation process can oxidize top portions of nanostructured channel regions 121N and fin or sheet base 106N to form IL layers 422N1-422N3 and can oxidize top portions of nanostructured channel regions 121P and fin or sheet base 106P to form IL layers 122P1-122P3.

In some embodiments, the wet oxidation process can include (i) using a mixture (referred to as "Piranha solution") of sulfuric acid ($H_2SO_4$) and hydrogen peroxide ($H_2O_2$) at a temperature of about 60° C. to about 100° C., (ii) using an ozone ($O_3$) solution of $O_3$ in DI water, (iii) using a mixture of ammonium hydroxide ($NH_4OH$) and $H_2O_2$, and/or (iv) using a mixture of hydrochloric acid (HCl) and $H_2O_2$. In some embodiments, the wet oxidation process can be followed by a densification process, which can include performing an anneal process on the structures of FIGS. 4A and 4B at a temperature of about 300° C. to about 550° C.

Figure 4A:
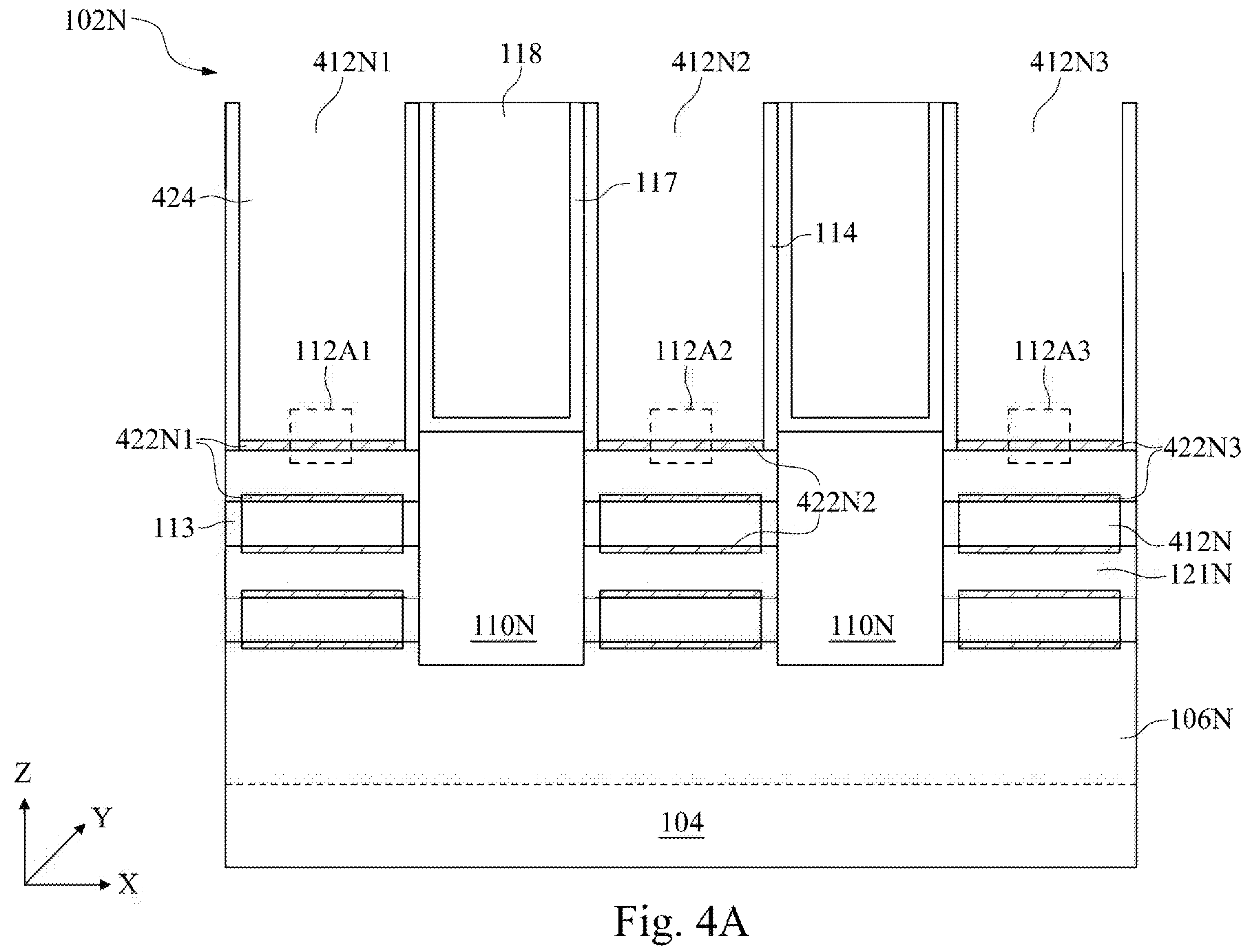
Figure 4B:
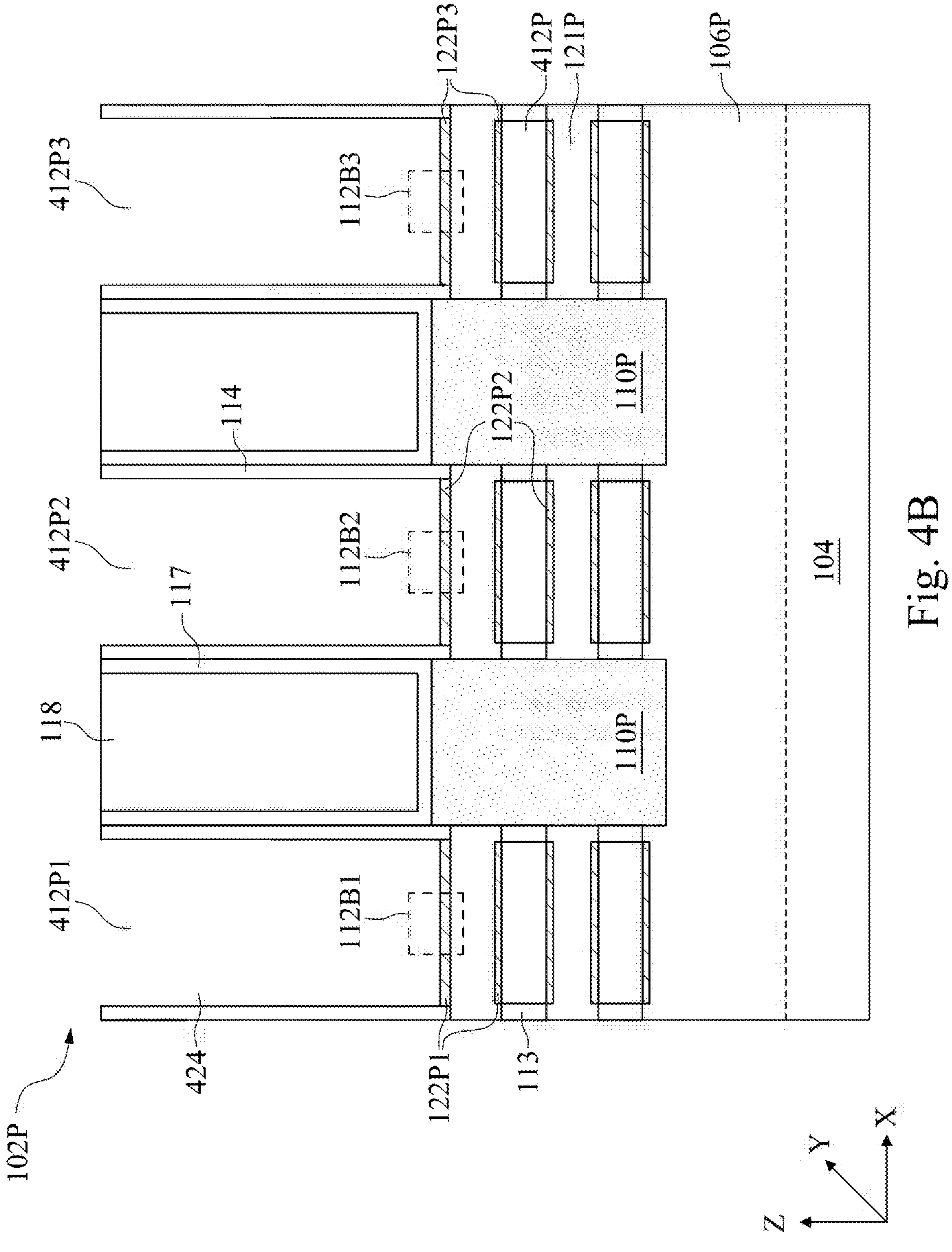

The subsequent processing on the structures of FIGS. 4A and 4B in operations 220-240 are described with reference to FIGS. 5A-22B. FIGS. 5A-22A are enlarged views of regions 112A1-112A3 of FIG. 4A, and FIGS. 5B-22B are enlarged views of regions 112B1-112B3 of FIG. 4B.

Figures 5A, 5B:
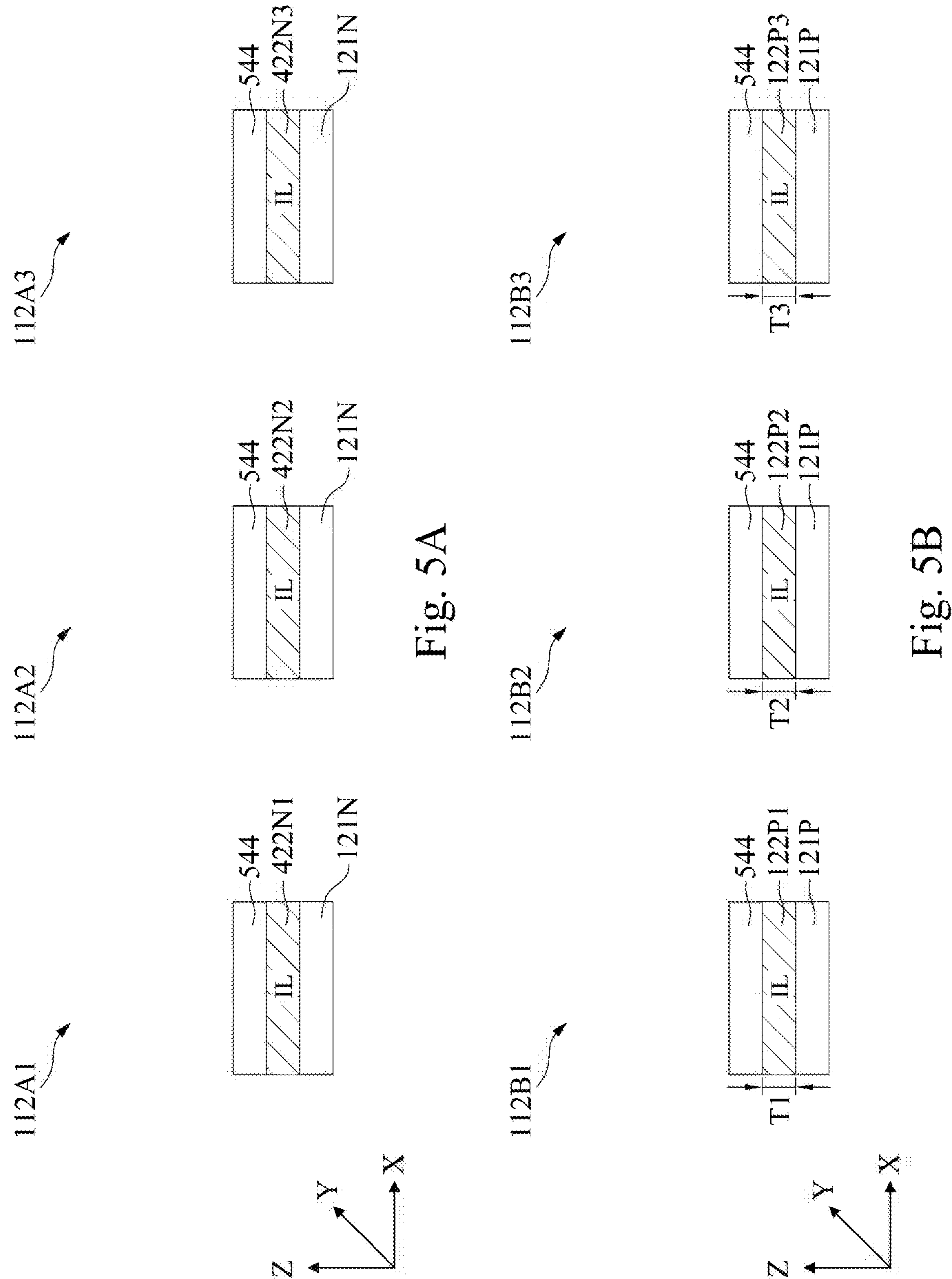

Referring to FIG. 2, in operation 220, a doping process is performed on the IL layers of the NFET. For example, as described with reference to FIGS. 5A-6B, a doping process is performed to dope IL layers 422N1-422N3 with metal dopants that induce N-dipoles of dipole layers 140N. The doping process can include sequential operations of (i) depositing a dopant source layer 544 on IL layers 422N1-422N3 and 122P1-122P3, as shown in FIGS. 5A and 5B, (ii) selectively removing portions of dopant source layer 544 on IL layers 122P1-122P3 using lithographic patterning and etching processes, as shown in FIG. 6B, (iii) performing a drive-in anneal process on the structures of FIGS. 6A and 6B to implant metal dopants into IL layers 422N1-422N3 to form doped IL layers 122N1-122N3, as shown in FIG. 6A, and (iv) removing dopant source layer 544 from the structures of FIG. 6A to form the structures of FIG. 7A.

The deposition of dopant source layer 544 can include depositing a metal oxide, which includes a metal with a lower electronegativity than that of a metal (e.g., Hf, Zr) in HK gate dielectric layers 124N1-124N3. In some embodiments, depositing the metal oxide can include depositing lutetium oxide (LuO), scandium oxide (ScO), yttrium oxide ($Y_2O_3$), thulium oxide ($Tm_2O_3$), or gadolinium oxide ($Gd_2O_3$) on IL layers 422N1-422N3 and 122P1-122P3 in a chemical vapor deposition (CVD) process or an atomic layer deposition (ALD) process. In some embodiments, depositing the metal oxide can include depositing the metal oxide with a thickness of about 0.5 nm to about 1 nm on IL layers 422N1-422N3 and 122P1-122P3 to adequately perform the doping process without compromising device manufacturing cost.

Figure 23:
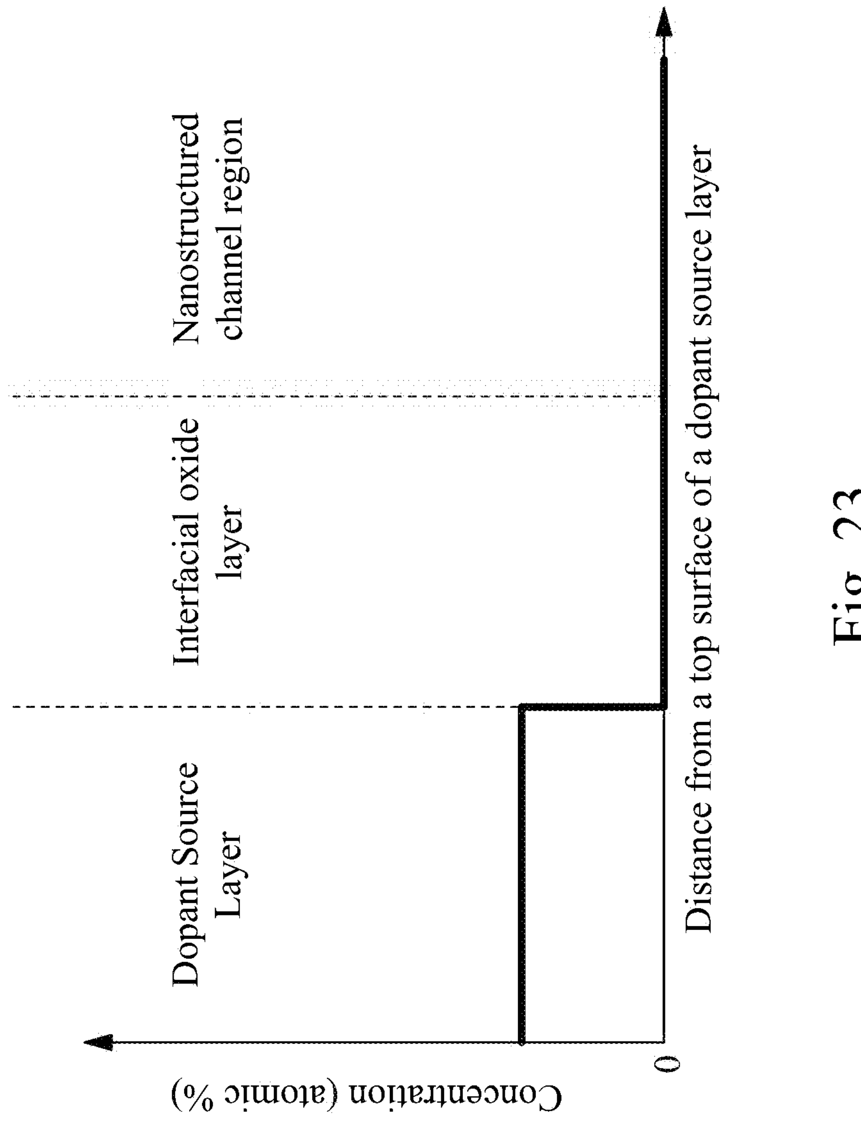
FIGS. 23 and 24 illustrate device characteristic of a semiconductor device with different gate structures at various stages of its fabrication process, in accordance with some embodiments.

The drive-in anneal process can implant metal dopants into IL layers 422N1-422N3 through diffusion of metal atoms from dopant source layer 544 into IL layers 422N1-422N3. The drive-in anneal process can include annealing the structures of FIGS. 6A and 6B at a temperature of about 500° C. to about 700° C. for a time period of about 10 seconds to about 30 seconds in an ambient of nitrogen. FIG. 23 shows a metal concentration profile across dopant source layer 544 and IL layers 422N1-422N3 along a Z-axis prior to the drive-in anneal process. After the drive-in anneal process and the diffusion of metal atoms from dopant source layer 544 to IL layers 422N1-422N3, metal dopants in doped IL 122N1-122N3 can have the dopant concentration profile of FIG. 1H.

Figures 6A, 6B:
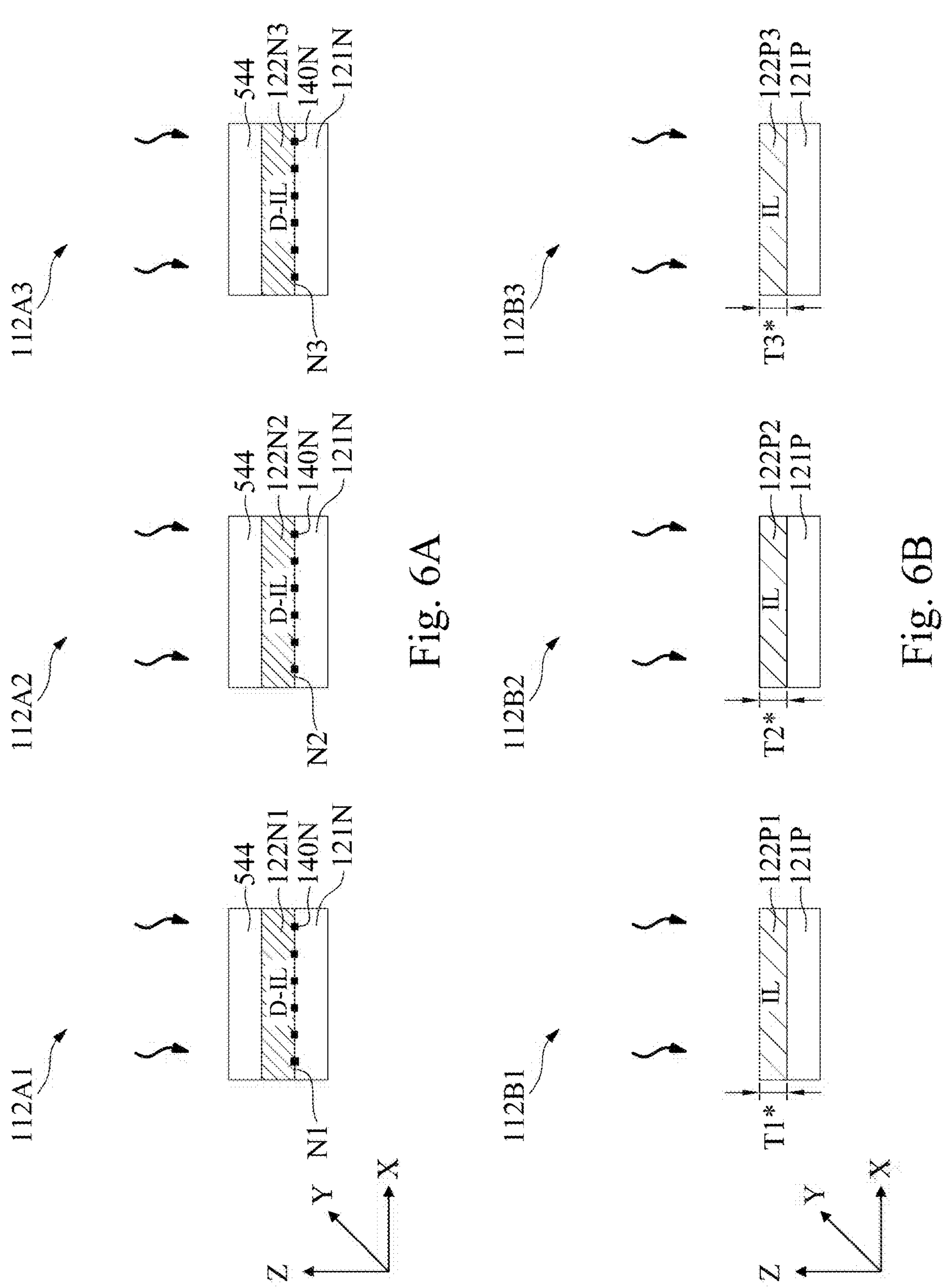
Figures 7A, 7B:
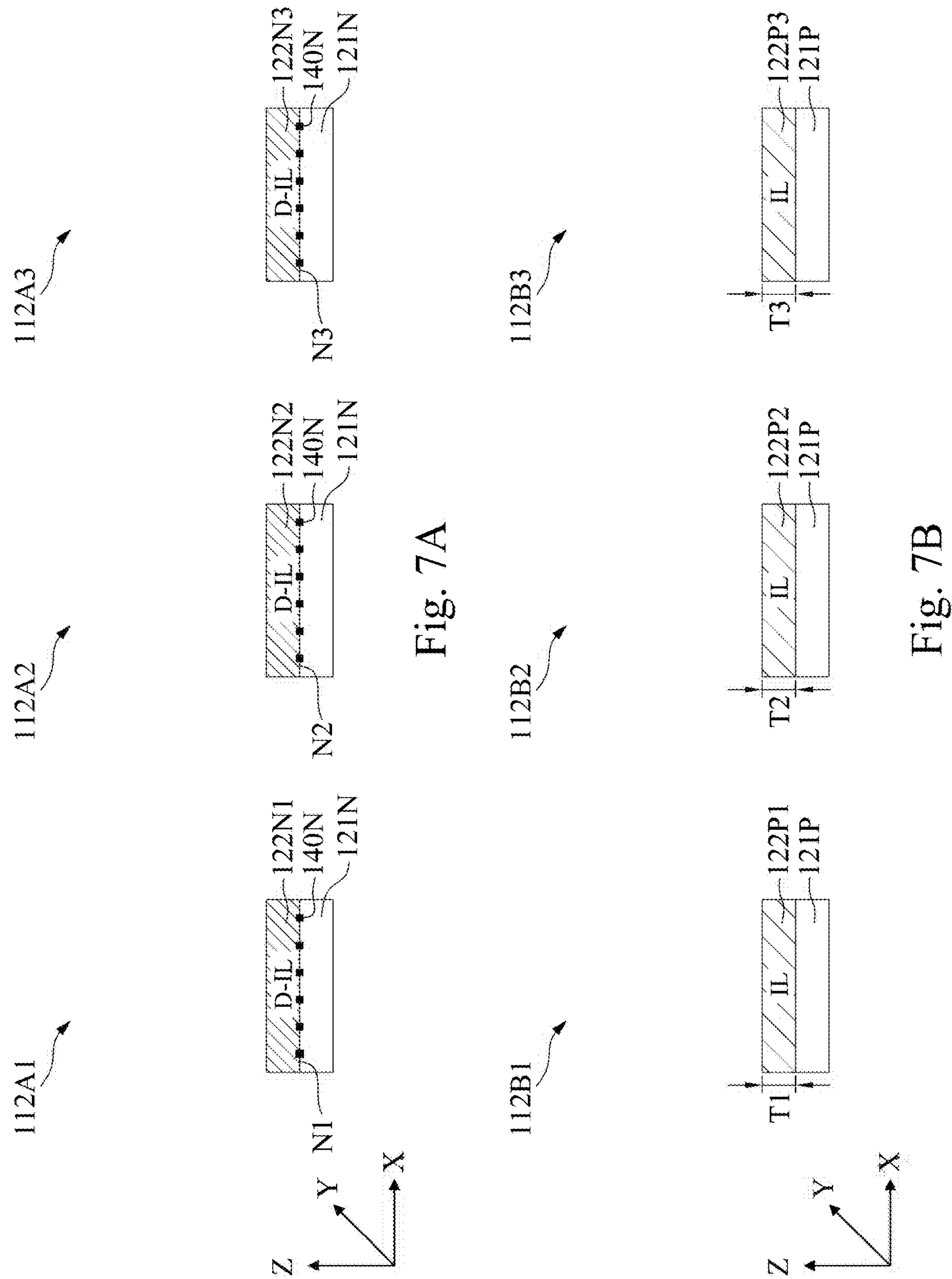
Figures 8A, 8B:
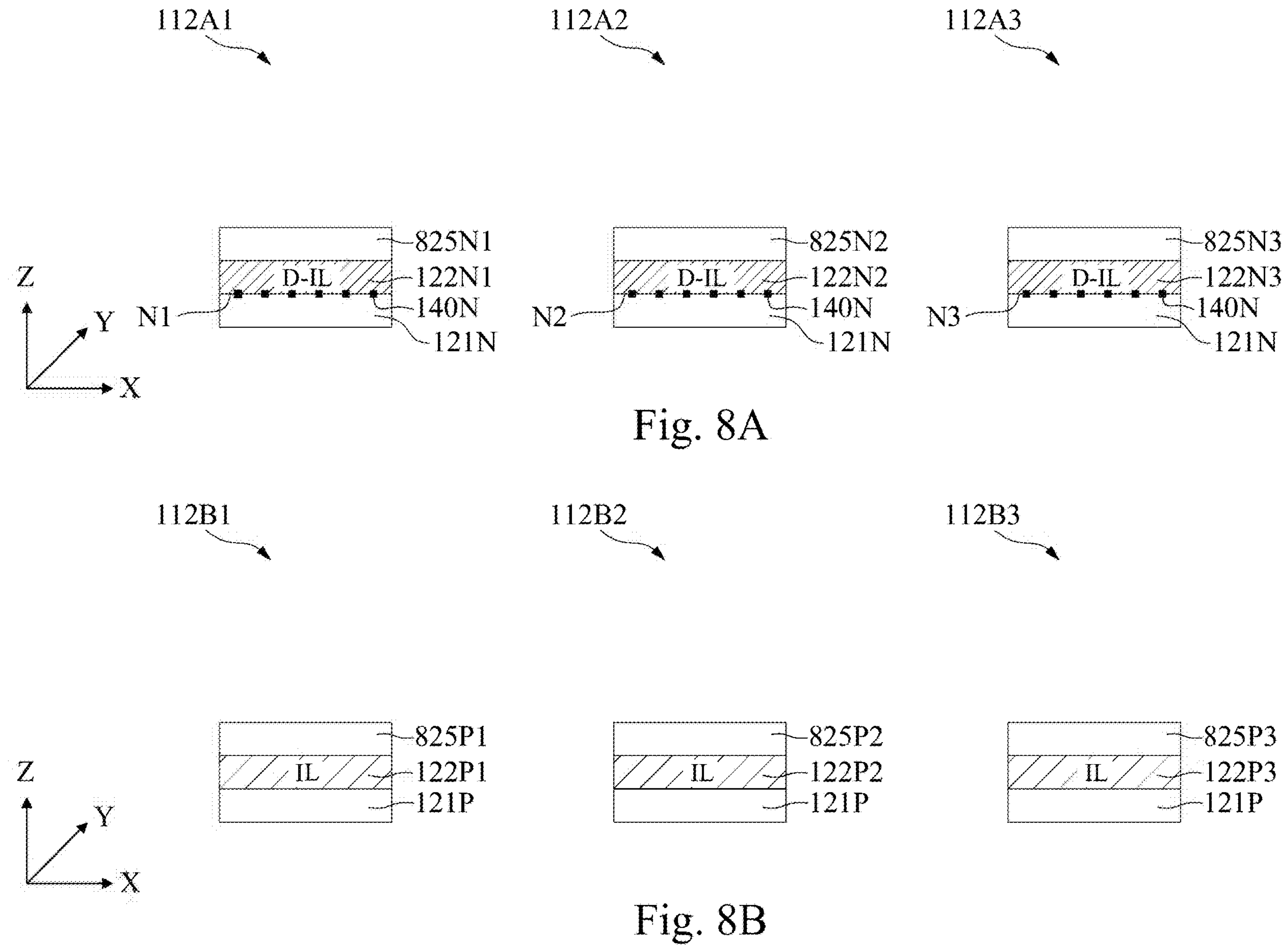

In some embodiments, portions of IL layers 122P1-122P3 can be etched during the etching of dopant source layer 544 from the structures of FIG. 6B. As a result, IL layers 122P1-122P3 can be reduced from thicknesses T1-T3 (shown in FIG. 5B) to thicknesses T1*-T3* (shown in FIG. 6B). An oxidation process can be performed on the structures of FIGS. 6A and 6B after the removal of dopant source layer 544 from the structures of FIG. 6A to regrow IL layers 122P1-122P3 to thicknesses T1-T3, as shown in FIG. 7B. In some embodiments, the oxidation process can include the wet oxidation process described in operation 215. In some embodiments, thicknesses of IL layers 122N1-122N3 and 122P1-122P3 can be substantially equal to each other after the oxidation process.

Referring to FIG. 2, in operation 225, a first HK gate dielectric layer is deposited in the gate openings of the NFET and the PFET. For example, as described with reference to FIGS. 8A and 8B, a first HK gate dielectric layer with HK gate dielectric layer portions ("HK portions") 825N1-825N3 and 825P1-825P3 are deposited on IL layers 122N1-122N3 and 122P1-122P3 in gate openings 412N1-412N3 and 412P1-412P3. These HK portions 825N1-825N3 and 825P1-825P3 also extend along sidewalls of gate openings 412N1-412N3 and 412P1-412P3, which are not shown for simplicity. In subsequent processing, HK portions 825N1-825N3 and 825P1-825P3 form doped HK gate dielectric layers 125N1-125N3 and 125P1-125P3. The deposition of the first HK dielectric layer can include depositing a layer of high-k dielectric material, such as $HfO_2$, $TiO_2$, HfZrO, $Ta_2O_3$, $HfSiO_4$, $ZrO_2$, and $ZrSiO_2$ with a thickness of about 1 nm to about 2 nm.

Referring to FIG. 2, in operation 230, a doping process is performed on the first HK gate dielectric layer. For example, as described with reference to FIGS. 9A-21B, a doping process is performed to dope HK portions 825N1-825N3 in gate openings 412N1-412N3 and to dope HK portions 825P1-825P3 in gate openings 412P1-412P3 at a same time. HK portions 825N1-825N3 are doped with a first type metal dopants that induce N-dipoles of dipole layers 142N1-142N3 and HK portions 825P1-825P3 are doped with a second type metal dopants that induce P-dipoles of dipole layers 142P1-142P3 at a same time. The first and second type metal dopants are different from each other.

Figures 9A, 9B:
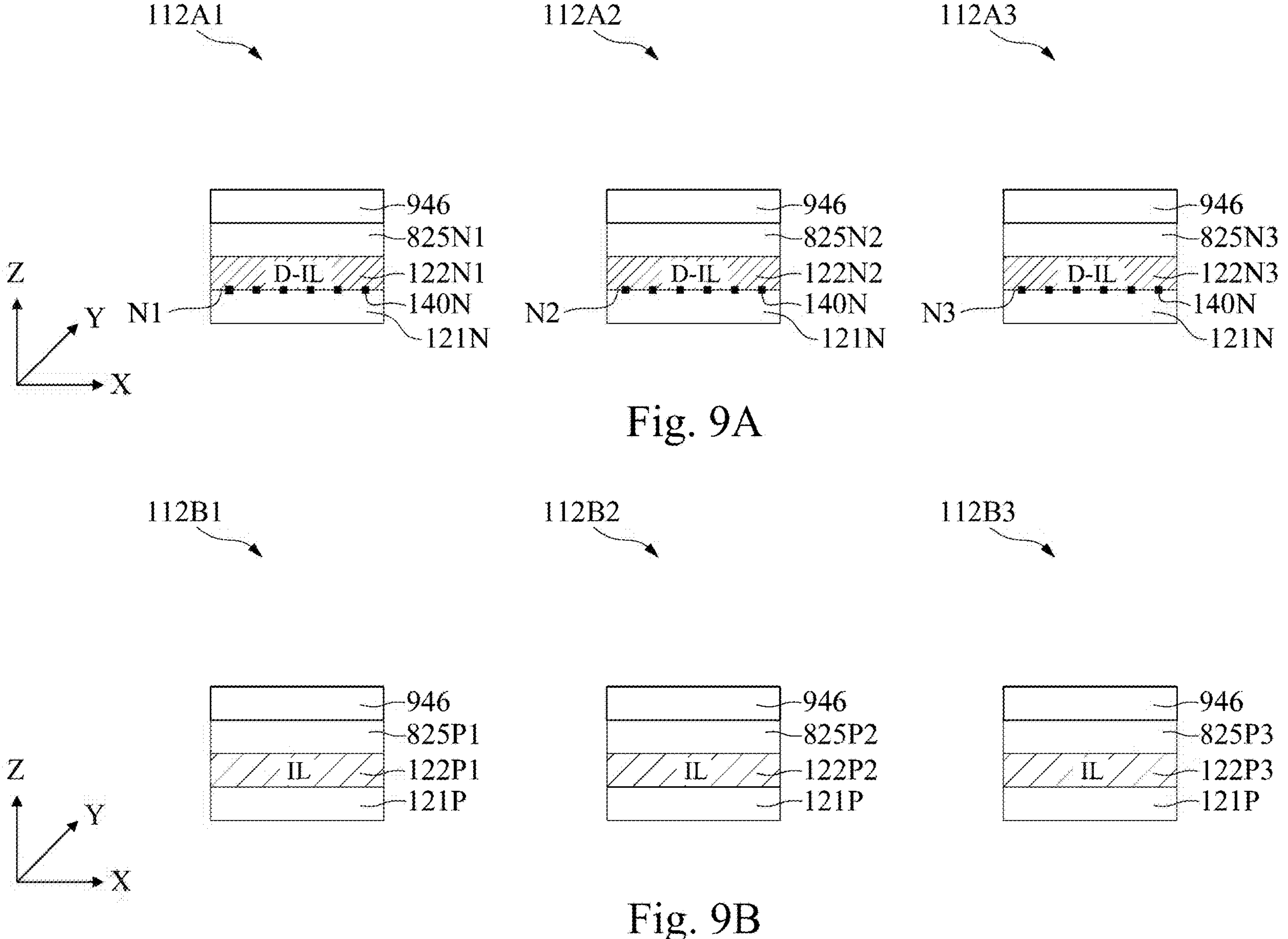
Figures 10A, 10B:
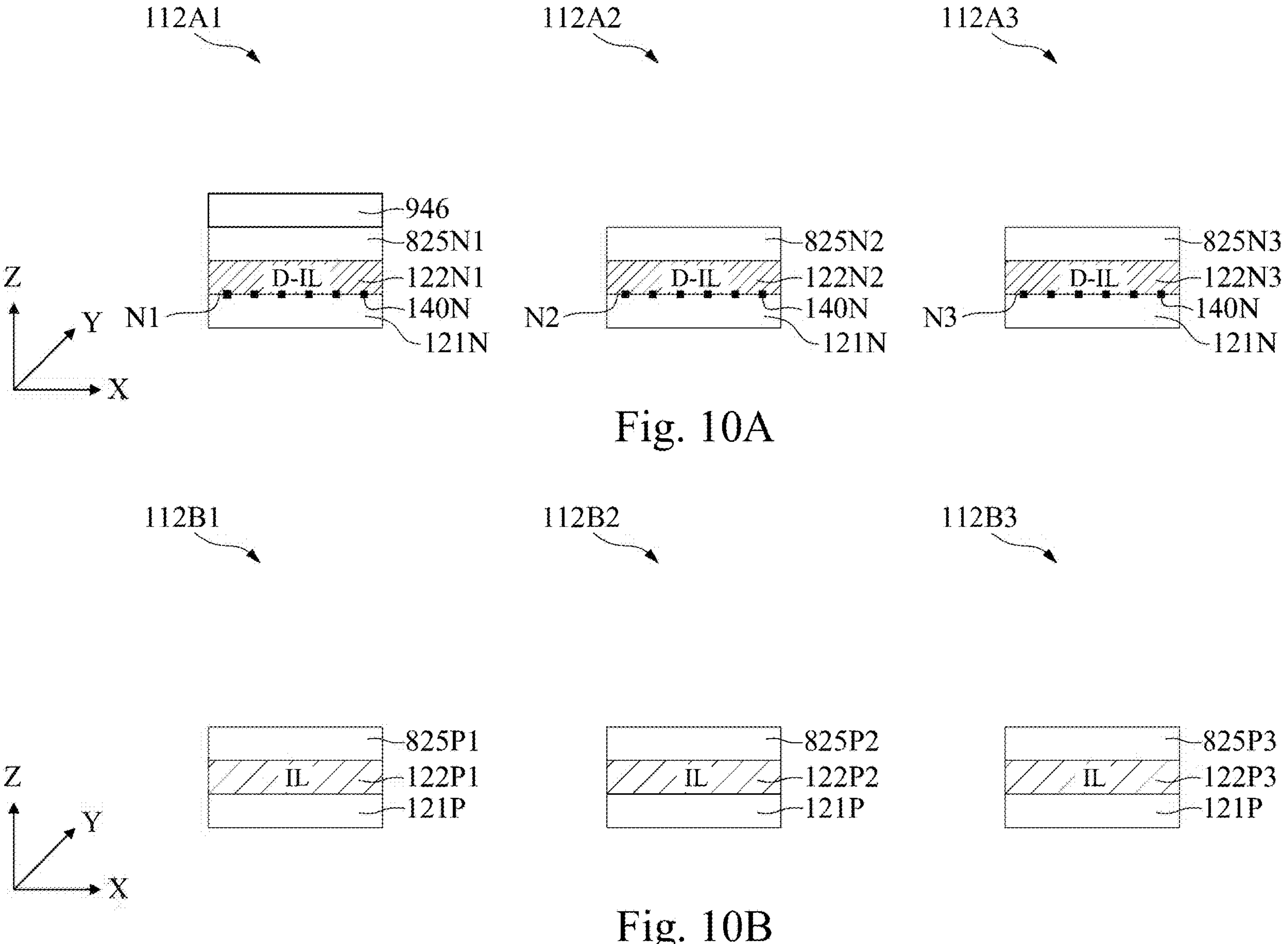
Figures 11A, 11B:
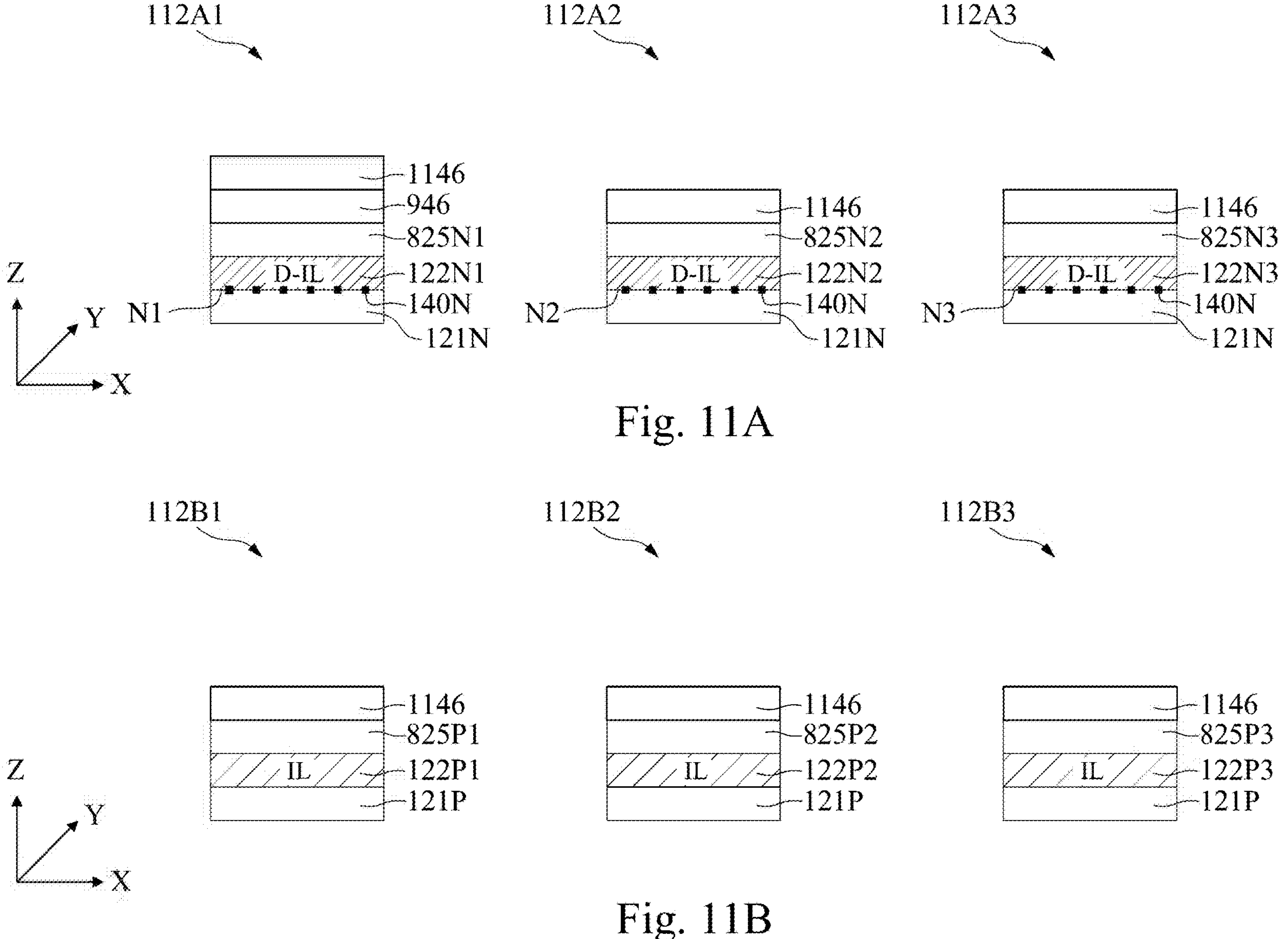
Figures 12A, 12B:
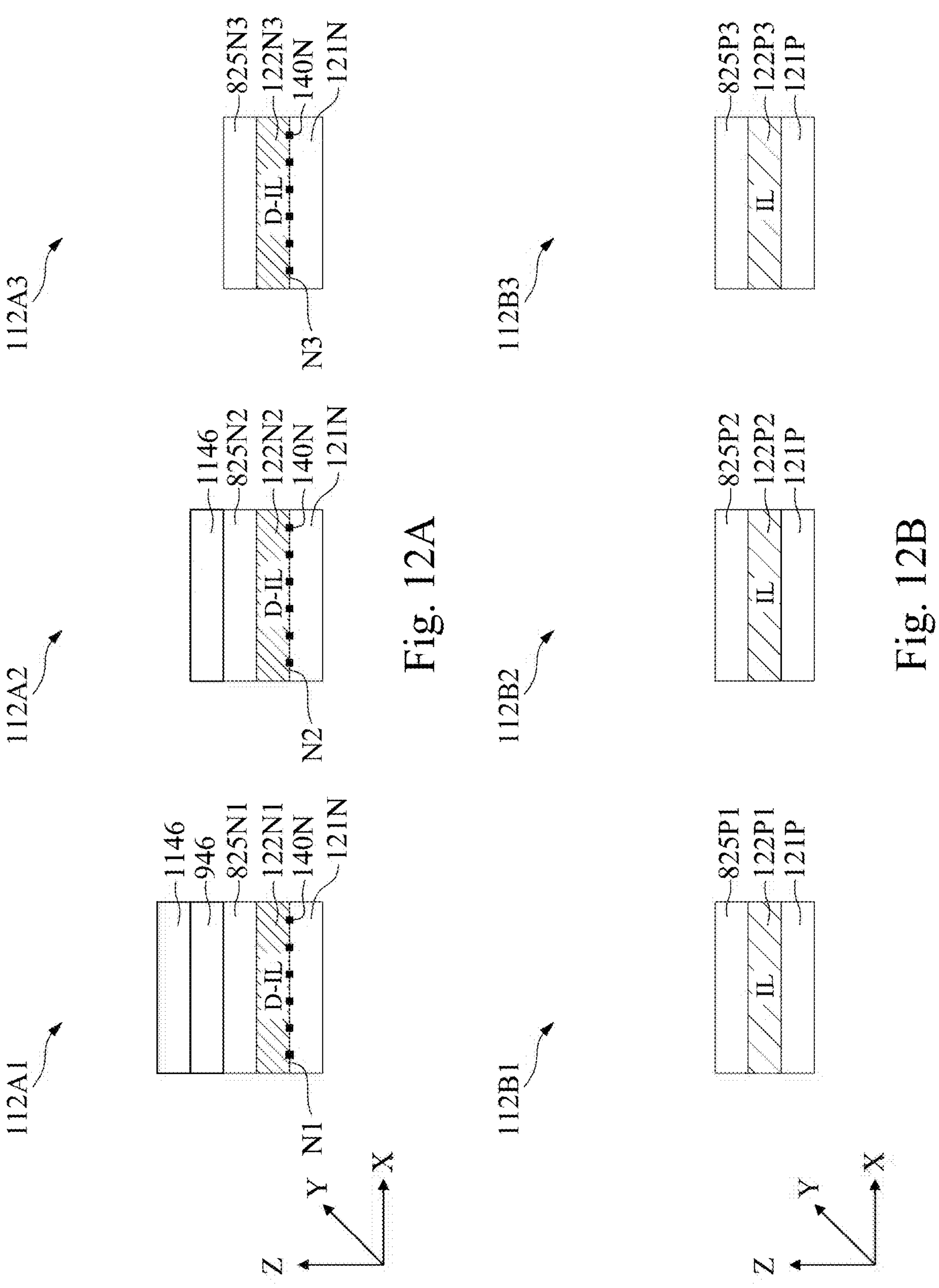
Figures 13A, 13B:
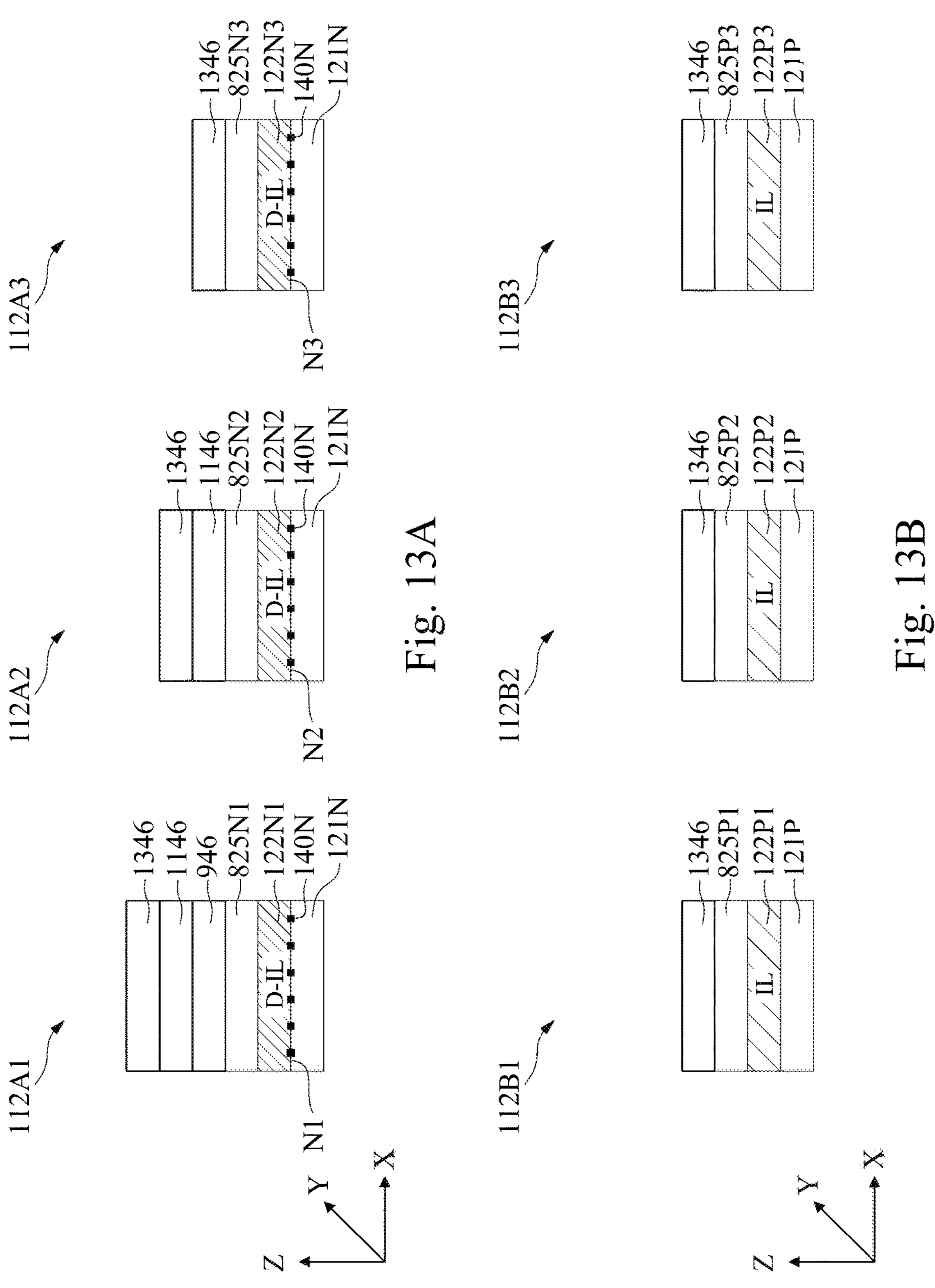
Figures 14A, 14B:
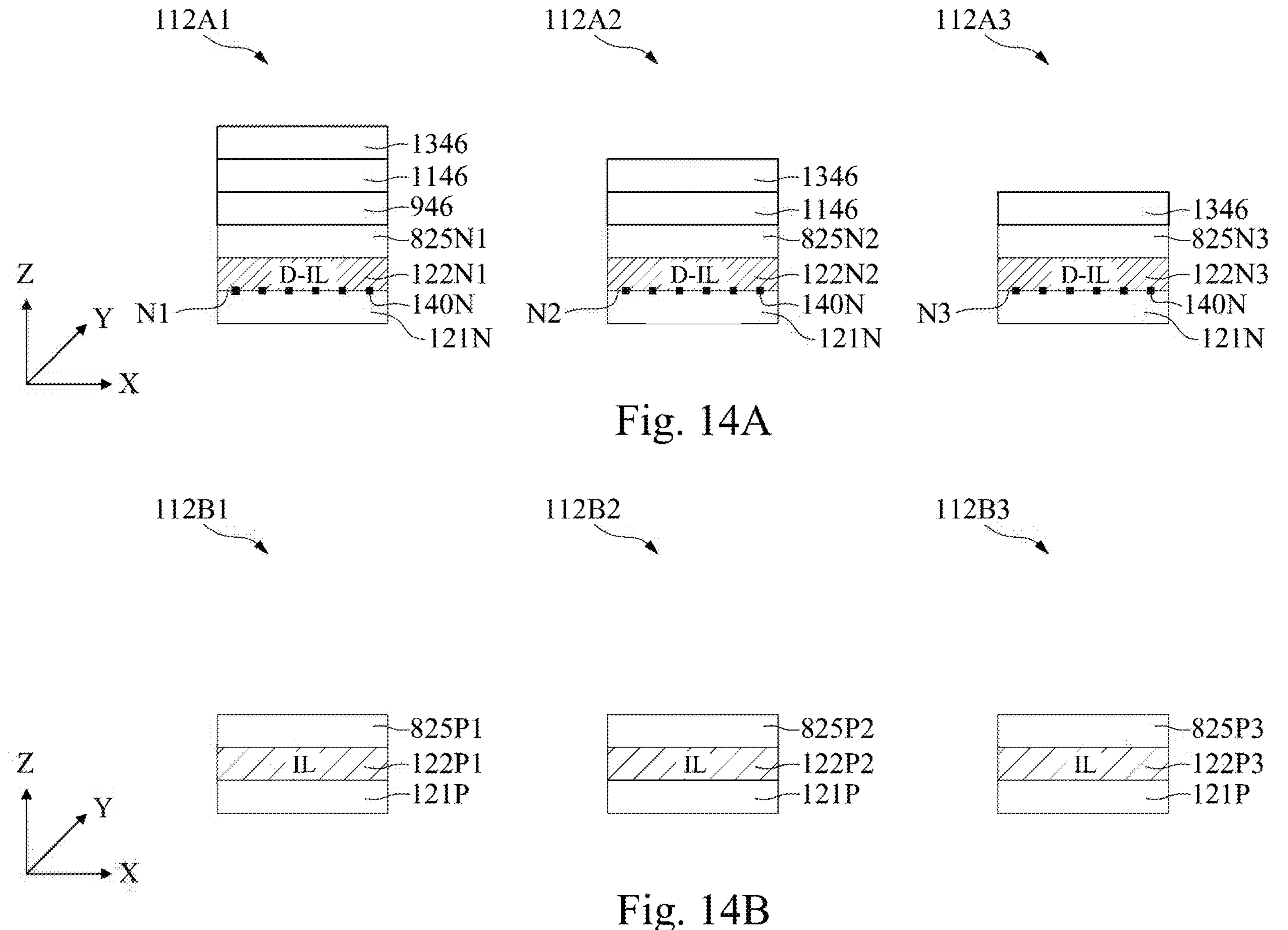
Figures 15A, 15B:
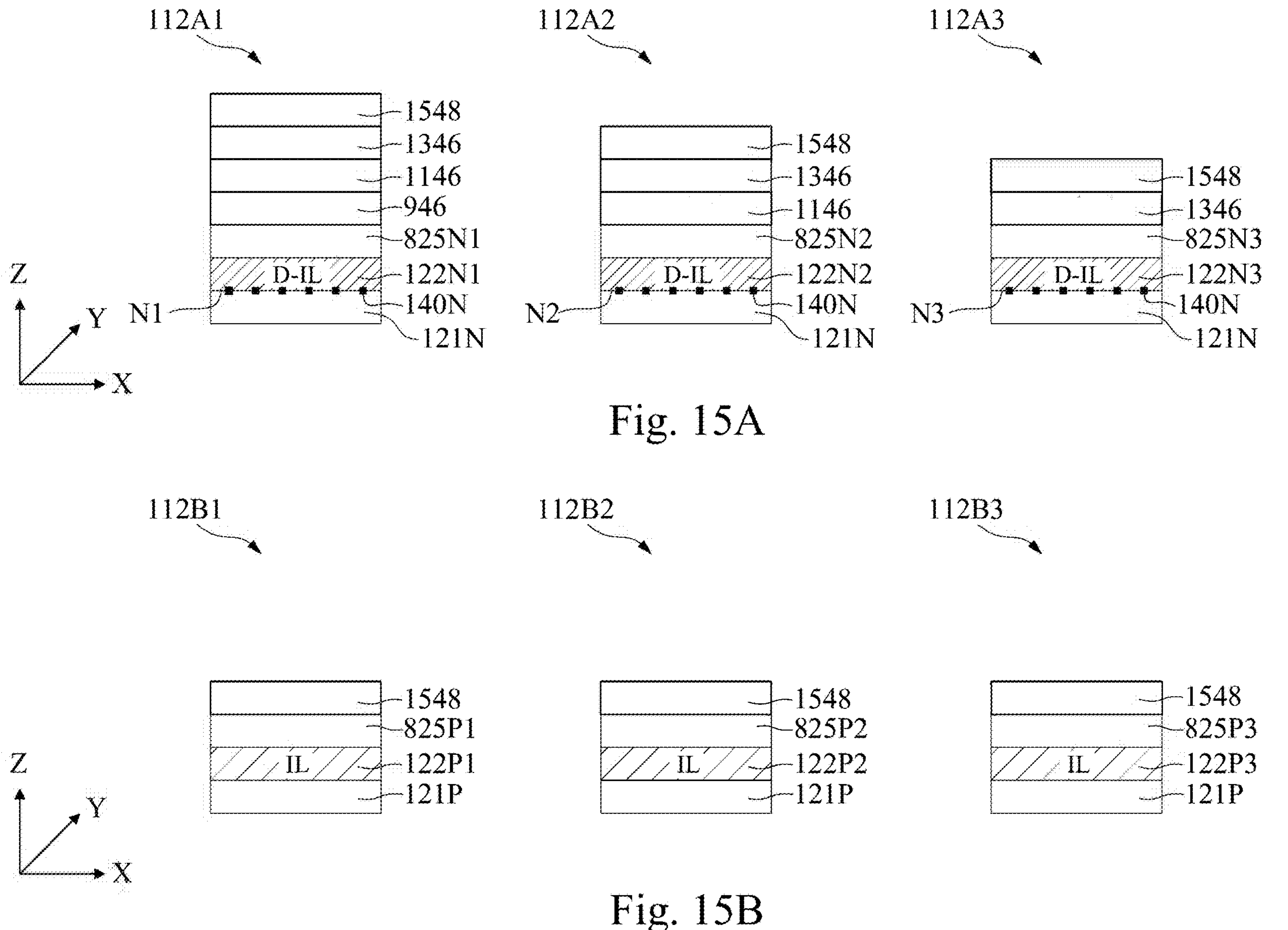
Figures 16A, 16B:
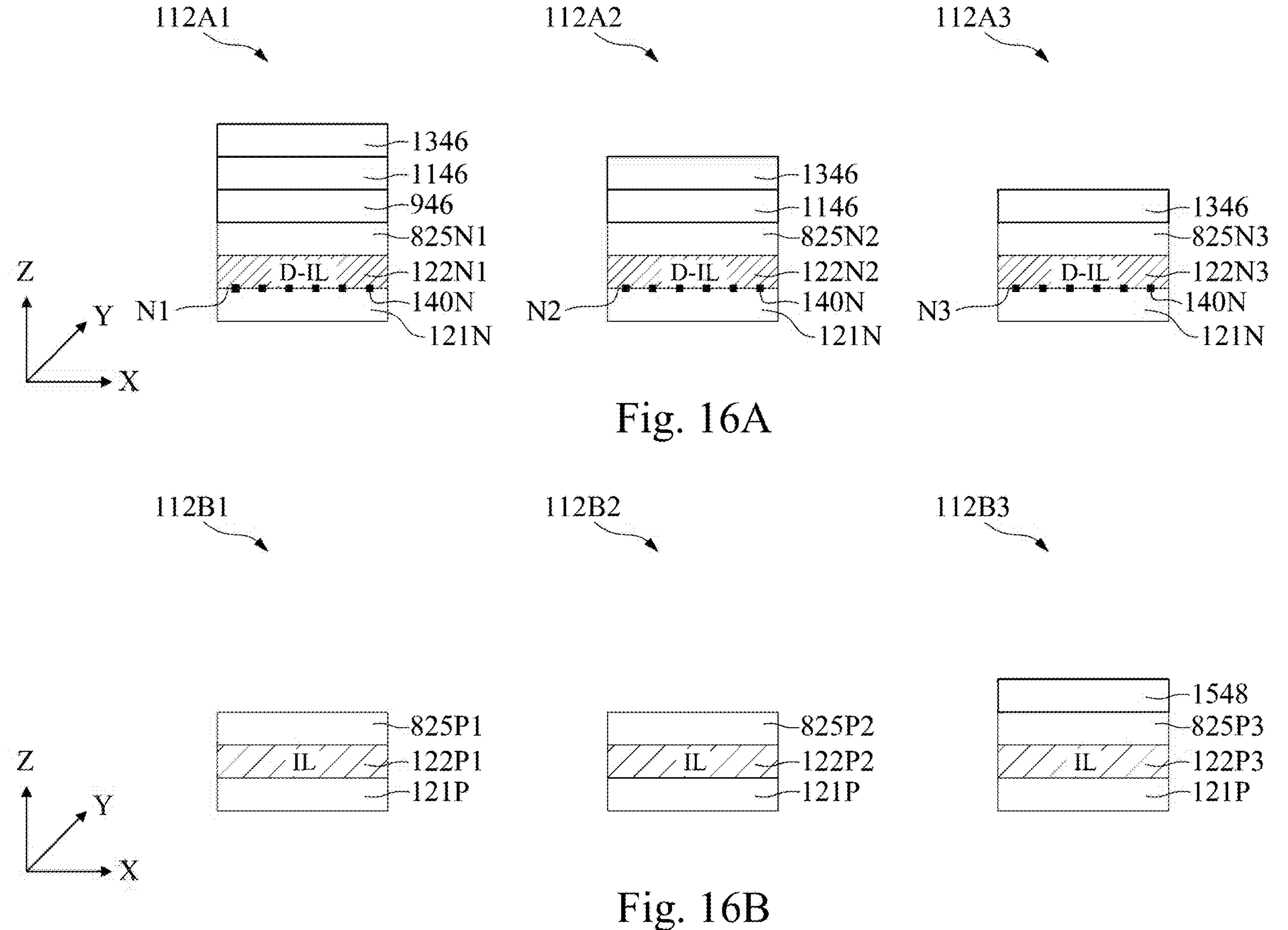
Figures 17A, 17B:
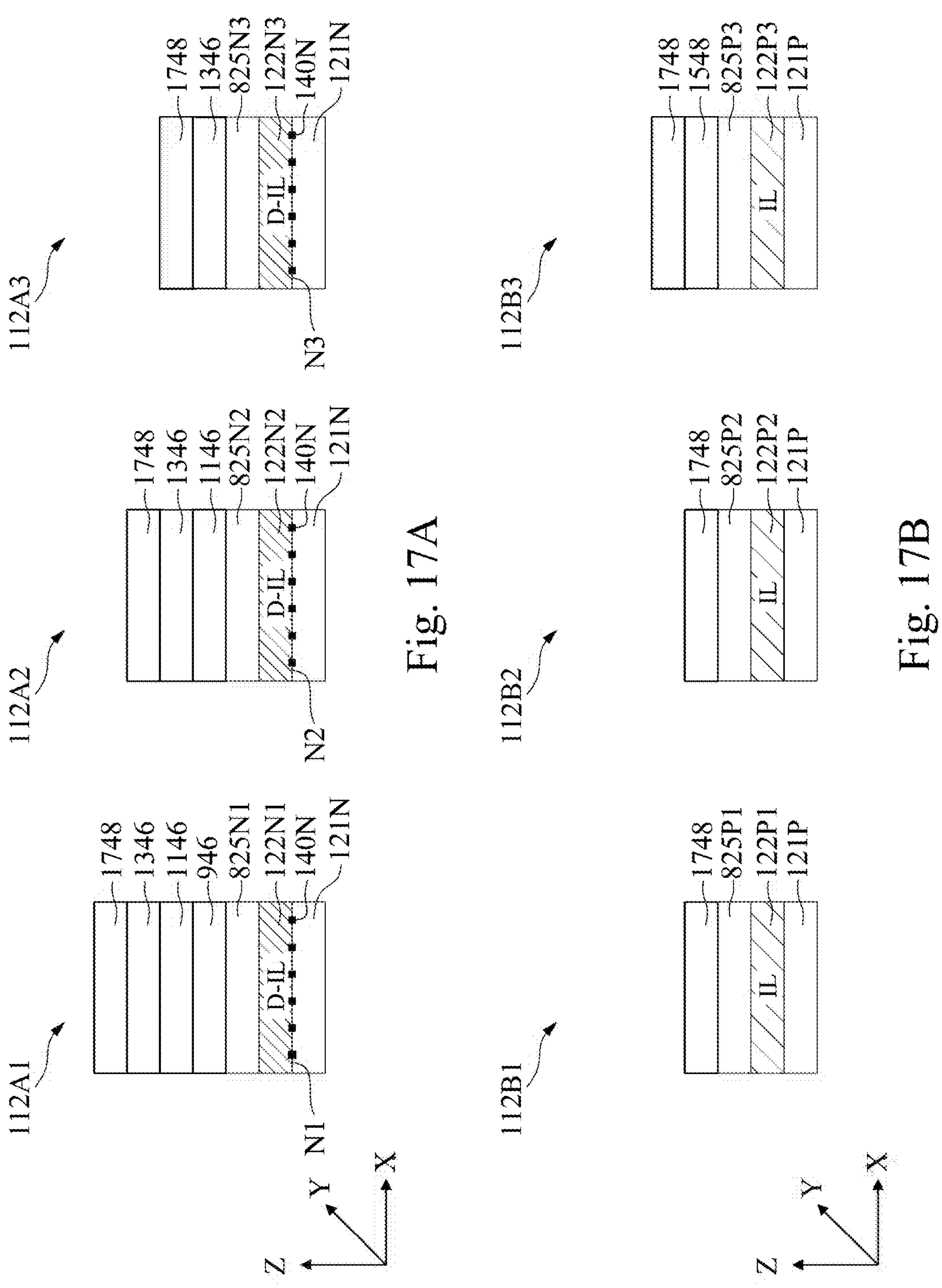
Figures 18A, 18B:
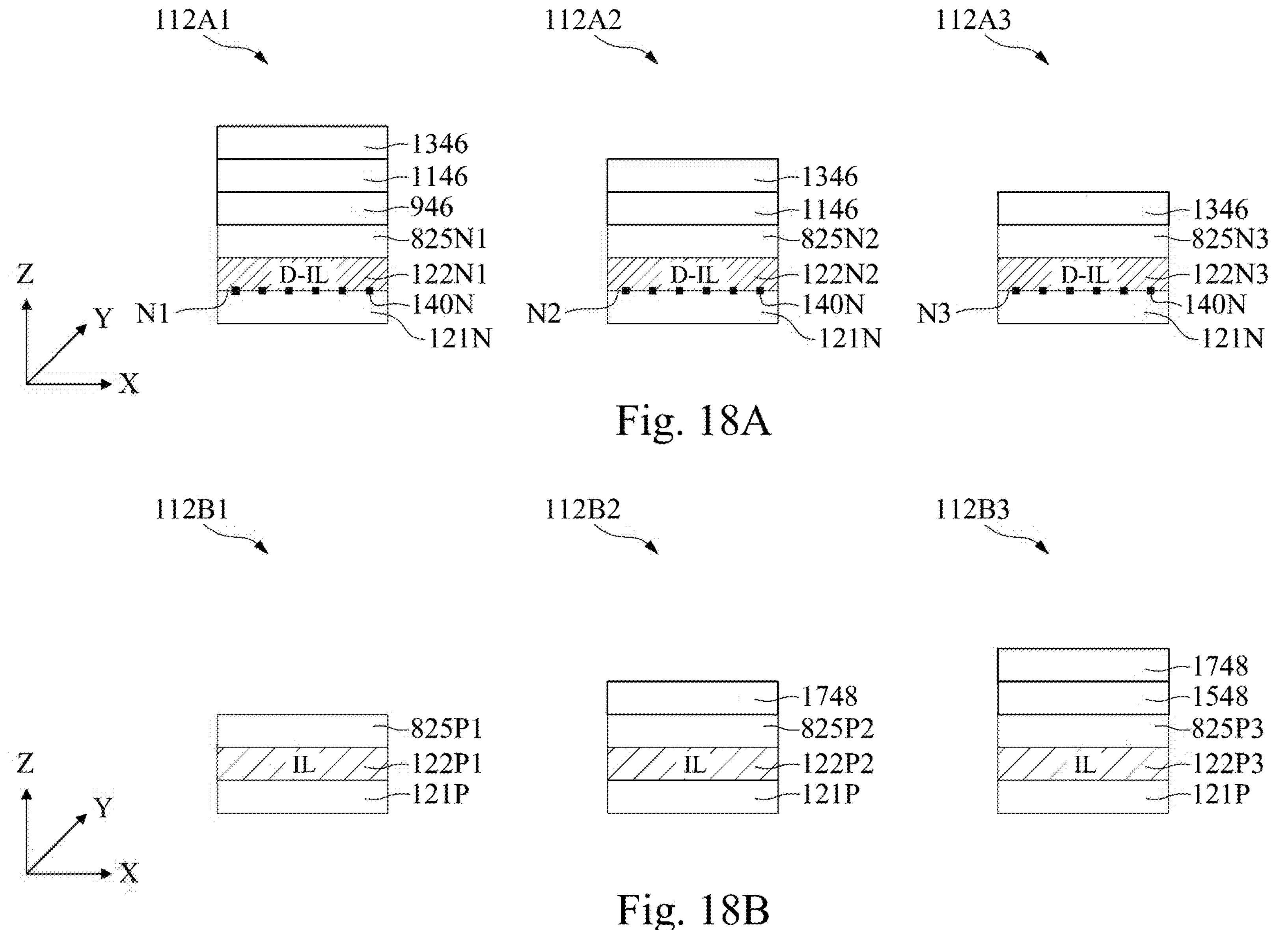
Figures 19A, 19B:
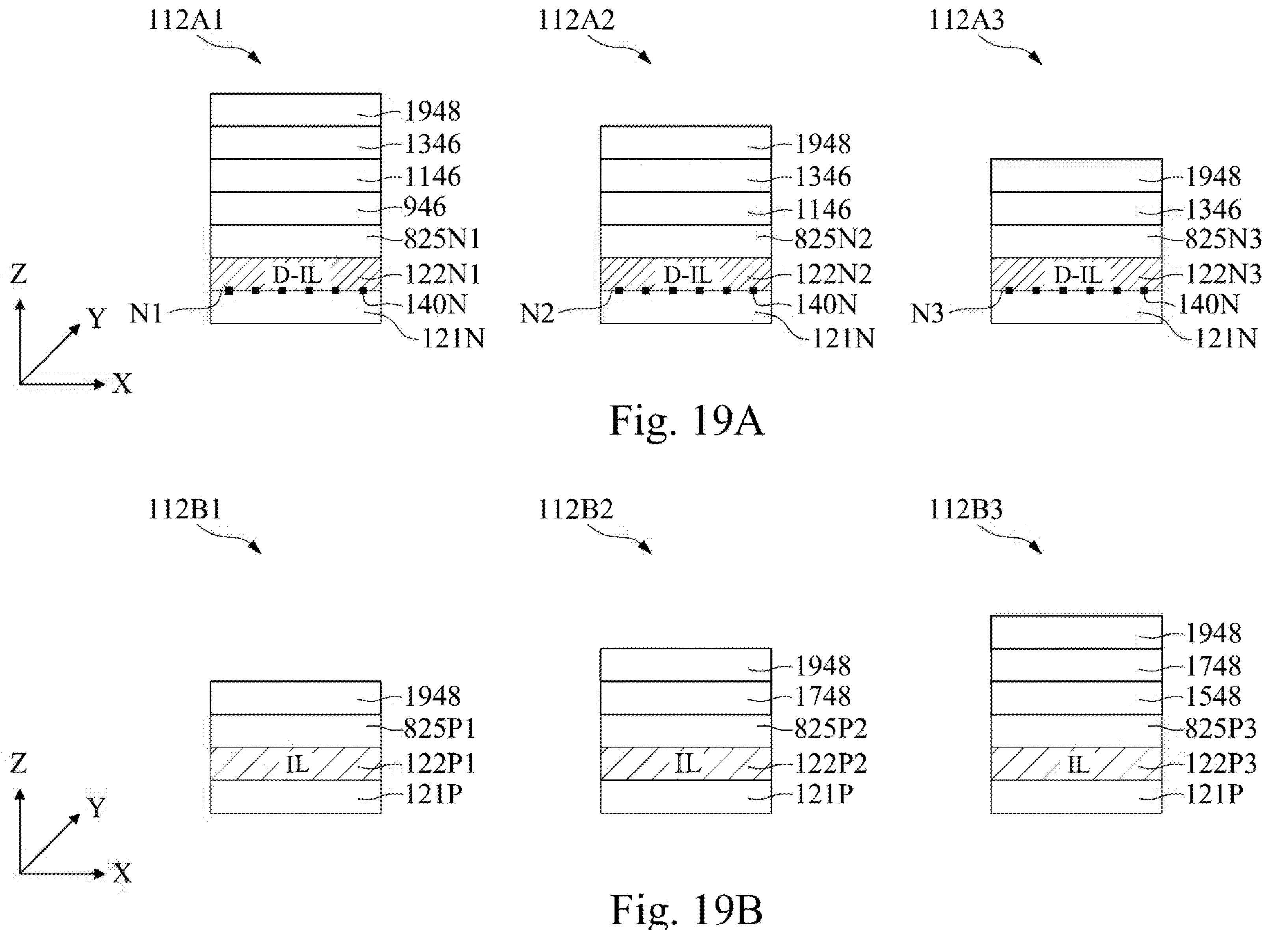
Figures 20A, 20B:
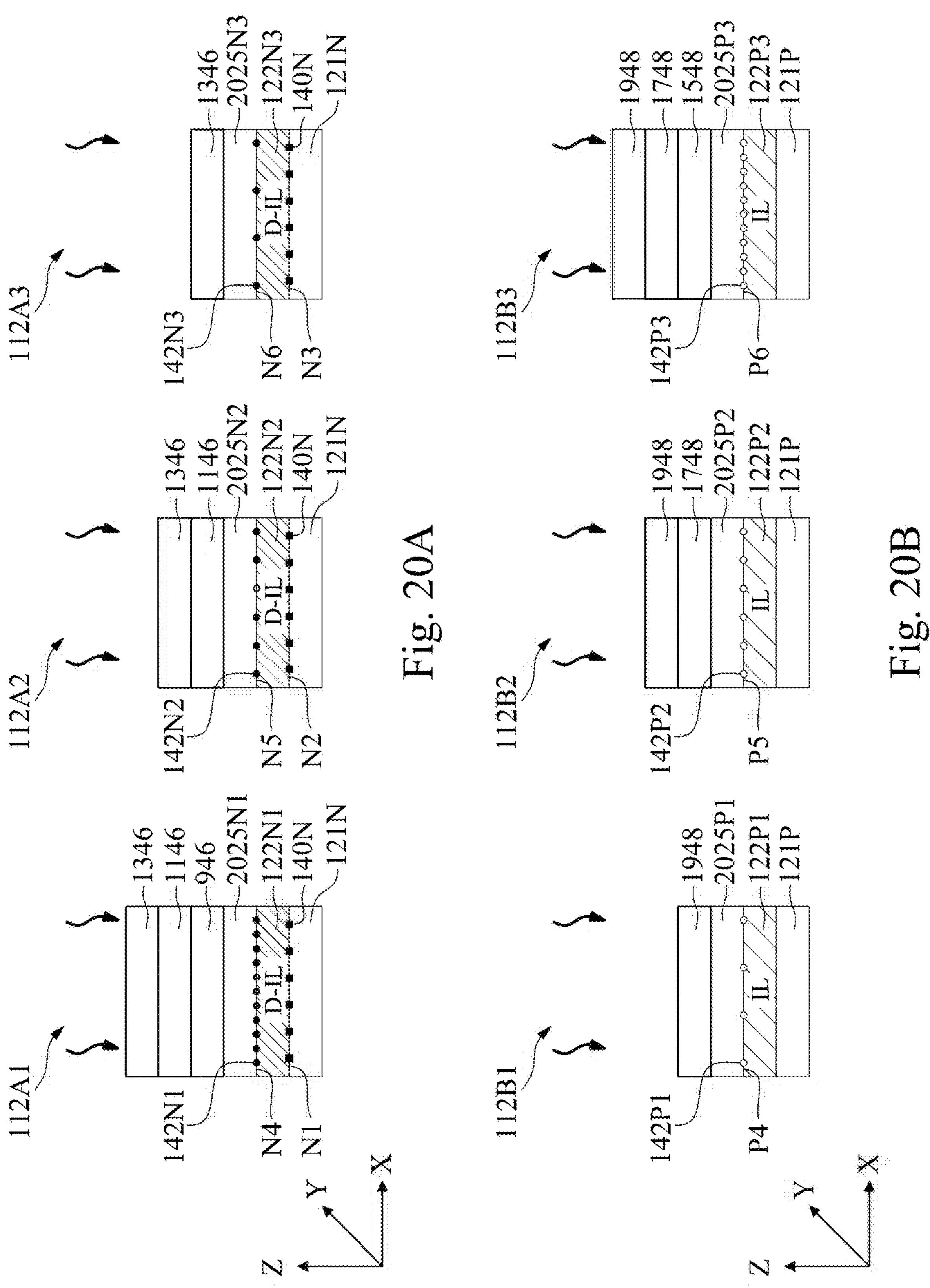
Figures 21A, 21B:
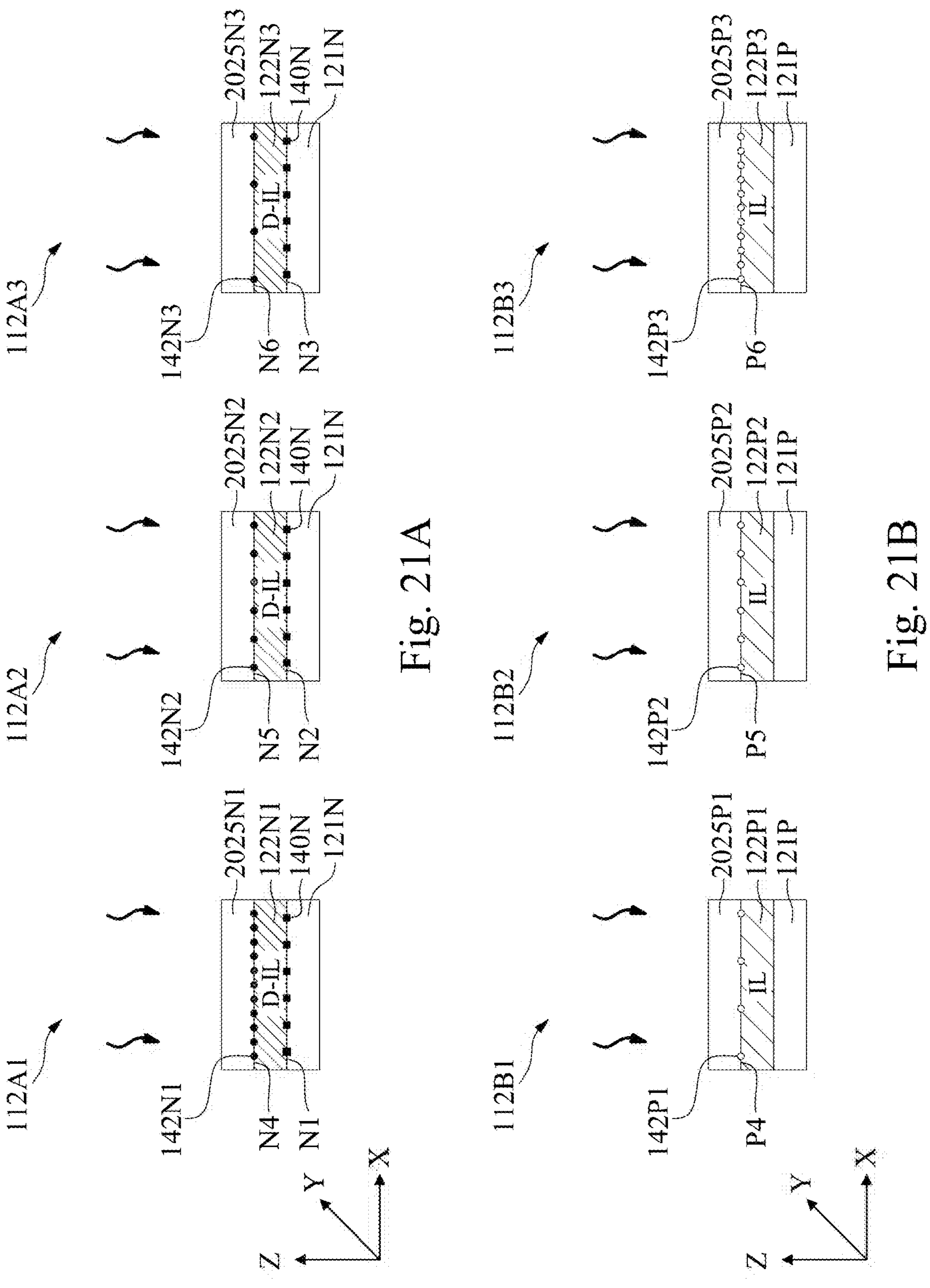
Figures 22A, 22B:
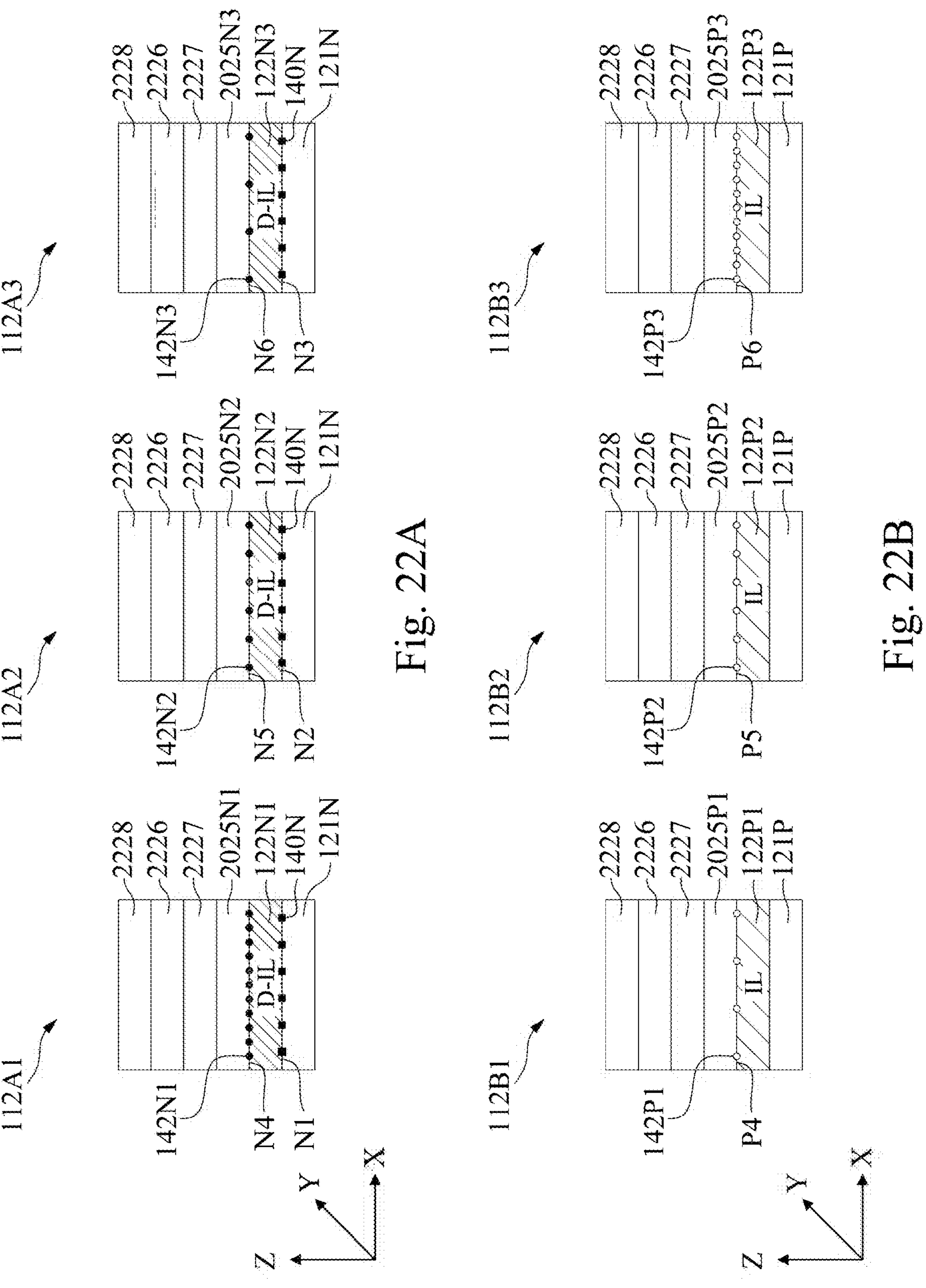

The doping process can include sequential operations of (i) depositing a dopant source layer 946 on HK portions 825N1-825N3 and 825P1-825P3, as shown in FIGS. 9A and 9B, (ii) selectively removing portions of dopant source layer 946 on HK portions 825N2-825N3 and 825P1-825P3 using lithographic patterning and etching processes to form the structures of FIGS. 10A and 10B, (iii) depositing a dopant source layer 1146 on dopant source layer 946 and HK portions 825N2-825N3 and 825P1-825P3, as shown in FIGS. 11A and 11B, (iv) selectively removing portions of dopant source layer 1146 on HK portions 825N3 and 825P1-825P3 using lithographic patterning and etching processes to form the structures of FIGS. 12A and 12B, (v) depositing a dopant source layer 1346 on dopant source layer 1146 and HK portions 825N3 and 825P1-825P3, as shown in FIGS. 13A and 13B, (vi) selectively removing portions of dopant source layer 1346 on HK portions 825P1-825P3 using lithographic patterning and etching processes to form the structures of FIGS. 14A and 14B, (vii) depositing a dopant source layer 1548 on dopant source layer 1346 and HK portions 825P1-825P3, as shown in FIGS. 15A and 15B, (viii) selectively removing portions of dopant source layer 1548 on HK portions 825P1-825P2 and dopant source layer 1346 using lithographic patterning and etching processes to form the structures of FIGS. 16A and 16B, (ix) depositing a dopant source layer 1748 on dopant source layers 1346 and 1548 and HK portions 825P1-825P2, as shown in FIGS. 17A and 17B, (x) selectively removing portions of dopant source layer 1748 on HK portions 825P1 and dopant source layer 1346 using lithographic patterning and etching processes to form the structures of FIGS. 18A and 18B, (xi) depositing a dopant source layer 1948 on dopant source layers 1346 and 1748 and HK portion 825P1, as shown in FIGS. 19A and 19B, (xii) selectively removing portions of dopant source layer 1948 on dopant source layer 1346 using lithographic patterning and etching processes to form the structures of FIGS. 20A and 20B, (xiii) performing a drive-in anneal process on the structures of FIGS. 20A and 20B to form doped HK portions 2025N1-2025N3 and 2025P1-2025P3, (xiv) removing dopant source layers 946, 1146, 1346, 1548, 1748, and 1948 from the structures of FIGS. 20A and 20B to form the structures of FIGS. 21A and 21B, and (xv) performing an anneal process on the structures of FIGS. 21A and 21B.

Though FIGS. 9A-20B show forming the dopant source layers of NFET 102N prior to forming the dopant source layers of PFET 102P, the formation of dopant source layers of NFET 102N and PFET 102P can be performed in any order. In some embodiments, dopant source layers 1548, 1748, and 1948 can be formed on HK portions 825P1-825P3 prior to forming dopant source layers 946, 1146, and 1346 on HK portions 825N1-825N3.

The deposition of each dopant source layers 946, 1146, and 1346 can include depositing an REM oxide, such as lanthanum oxide ($La_2O_3$), yttrium oxide ($Y_2O_3$), cerium oxide ($CeO_2$), ytterbium oxide ($Yb_2O_3$), and erbium oxide ($Er_2O_3$) in a CVD process or an ALD process. In some embodiments, depositing the REM oxide for each dopant source layers 946, 1146, and 1346 can include depositing the REM oxide with a thickness of about 1 nm to about 3 nm to adequately dope HK portions 825N1-825N3 without compromising device manufacturing cost. In some embodiments, dopant source layers 946, 1146, and 1346 can have the same REM oxide.

The deposition of each dopant source layers 1548, 1748, and 1948 can include depositing a metal oxide, such as zinc oxide (ZnO), $GeO_2$, aluminum oxide ($Al_2O_3$), titanium oxide ($TiO_2$), and vanadium oxide ($V_2O_3$) in a CVD process or an ALD process. In some embodiments, depositing the metal oxide for each dopant source layers 1548, 1748, and 1948 can include depositing the metal oxide with a thickness of about 1 nm to about 3 nm to adequately dope HK portions 825P1-825P3 without compromising device manufacturing cost. In some embodiments, dopant source layers 1548, 1748, and 1948 can have the same metal oxide.

Different number of dopant source layers are deposited on HK portions 825N1-825N3 for doping HK portions 825N1-825N3 with different concentrations of the first type metal dopants to induce different concentrations of N-dipoles in dipole layers 142N1-142N3. For example, the stack of three dopant source layers 946, 1146, and 1346 can implant a higher concentration of the first type metal dopants into HK portion 825N1 than that implanted from the stack of two dopant source layers 946 and 1146 into HK portion 825N2 and from one dopant source layer 946 into HK portion 825N3. Similarly, different number of dopant source layers are deposited on HK portions 825P1-825P3 for doping HK portions 825P1-825P3 with different concentrations of the second type metal dopants to induce different concentrations of P-dipoles in dipole layers 142P1-142P3. For example, the stack of three dopant source layers 1548, 1748, and 1948 can implant a higher concentration of the second type metal dopants into HK portion 825P3 than that implanted from the stack of two dopant source layers 1748 and 1948 into HK portion 825P2 and from one dopant source layer 1948 into HK portion 825P1.

The drive-in anneal process can implant the first type metal dopants into (i) HK portion 825N1 through diffusion of metal atoms from dopant source layers 946, 1146, and 1346 into HK portion 825N1 to form doped HK portion 2025N1, (ii) HK portion 825N2 through diffusion of metal atoms from dopant source layers 1146 and 1346 into HK portion 825N2 to form doped HK portion 2025N2, and (iii) HK portion 825N3 through diffusion of metal atoms from dopant source layers 1346 into HK portion 825N3 to form doped HK portion 2025N3. At the same time, the drive-in anneal process can implant the second type metal dopants into (i) HK portion 825P3 through diffusion of metal atoms from dopant source layers 1548, 1748, and 1948 into HK portion 825P3 to form doped HK portion 2025P3, (ii) HK portion 825P2 through diffusion of metal atoms from dopant source layers 1748 and 1948 into HK portion 825P2 to form doped HK portion 2025P2, and (iii) HK portion 825P1 through diffusion of metal atoms from dopant source layers 1948 into HK portion 825P1 to form doped HK portion 2025P1.

Figure 24:
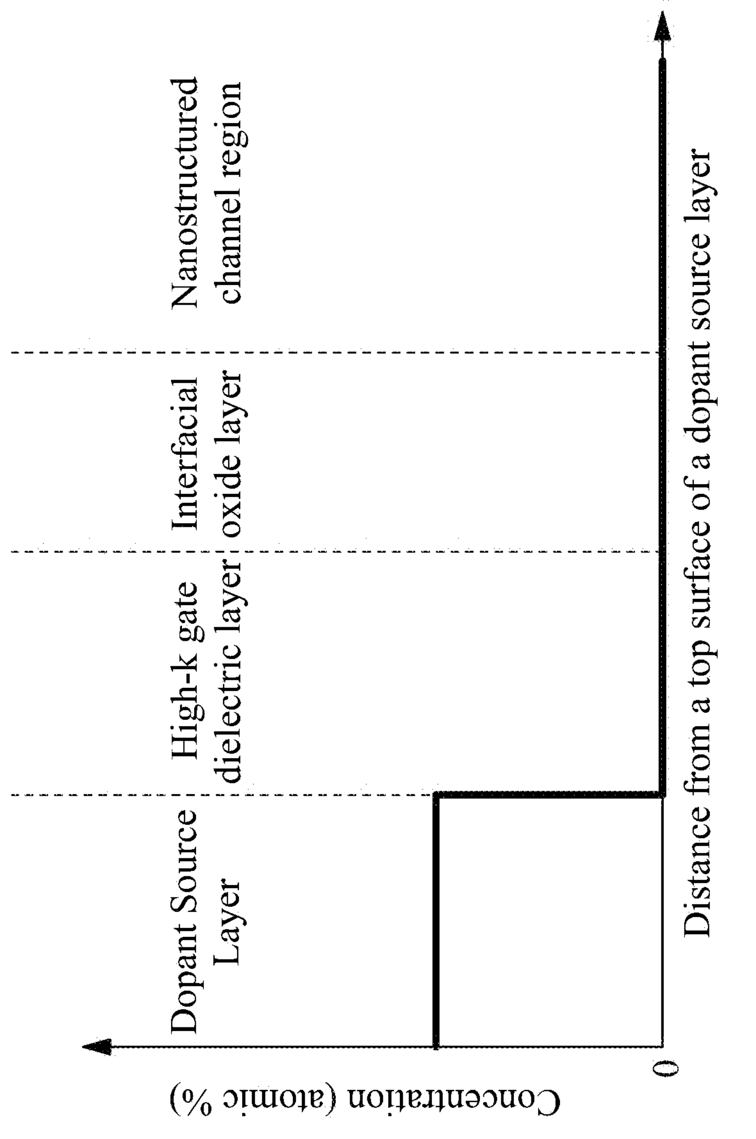

The drive-in anneal process can include annealing the structures of FIGS. 20A and 20B at a temperature of about 500° C. to about 700° C. for a time period of about 10 seconds to about 30 seconds in an ambient of nitrogen. Prior to the drive-in anneal process, the metals of dopant source layers 946, 1146, 1346, 1548, 1748, and 1948 can have a concentration profile, as shown in FIG. 24, across dopant source layers 946, 1146, 1346, 1548, 1748, and 1948, HK portions 825N1-825N3 and 825P1-825P3, and IL layers 122N1-122N3 and 122P1-122P3 along a Z-axis. After the drive-in anneal process and the diffusion of first and second type metal atoms into HK portions 825N1-825N3 and 825P1-825P3, metal dopants in doped HK portions 2025N1-2025N3 and 2025P1-2025P3 can have the dopant concentration profile of FIG. 1I. In some embodiments, the anneal process performed after the removal of dopant source layers 946, 1146, 1346, 1548, 1748, and 1948 can be similar to the drive-in anneal process.

Referring to FIG. 2, in operation 235, a second HK gate dielectric layer is deposited in the gate openings of the NFET and the PFET. For example, as described with reference to FIGS. 22A and 22B, a second HK gate dielectric layer 2227 is deposited on HK portions 825N1-825N3 and 825P1-825P3 in gate openings 412N1-412N3 and 412P1-412P3. The deposition of second HK gate dielectric layer 2227 can include depositing a layer of high-k dielectric material, such as $HfO_2$, $TiO_2$, HfZrO, $Ta_2O_3$, $HfSiO_4$, $ZrO_2$, and $ZrSiO_2$ with a thickness of about 0.5 nm to about 1 nm. In subsequent processing, second HK gate dielectric layer 2227 form undoped HK gate dielectric layers 127N1-127N3 and 127P1-127P3.

Referring to FIG. 2, in operation 240, a pWFM layer is deposited on the second HK gate dielectric layer and a gate metal fill layer is deposited on the pWFM layer. For example, as described with reference to FIGS. 22A and 22B, a pWFM layer 2226 is deposited on second HK gate dielectric layer 2227 and a gate metal fill layer 2228 is deposited on pWFM layer 2226. The deposition of pWFM 2226 can include depositing a metal layer, a metal nitride layer, or a metal-alloy layer with a work function value equal to or greater than 4.5 eV, such as TIN, TiSiN, Ti—Au alloy, Ti—Cu alloy, TaN, TaSiN, Ta—Au alloy, Ta—Cu, MON, and W. The deposition of gate metal fill layer 2228 can be followed by a chemical mechanical polishing (CMP) process and an etching process on gate structures 112N1-112N3 and 112P1-112P3 to form HK gate dielectric layers 124N1-124N2 and 124P1-124P2, pWFM layers 126, and gate metal fill layers 128, as shown in FIGS. 1B-1E. The etching process can be followed by the formation of conductive capping layers 130 and insulating capping layers 132.

Figure 25:
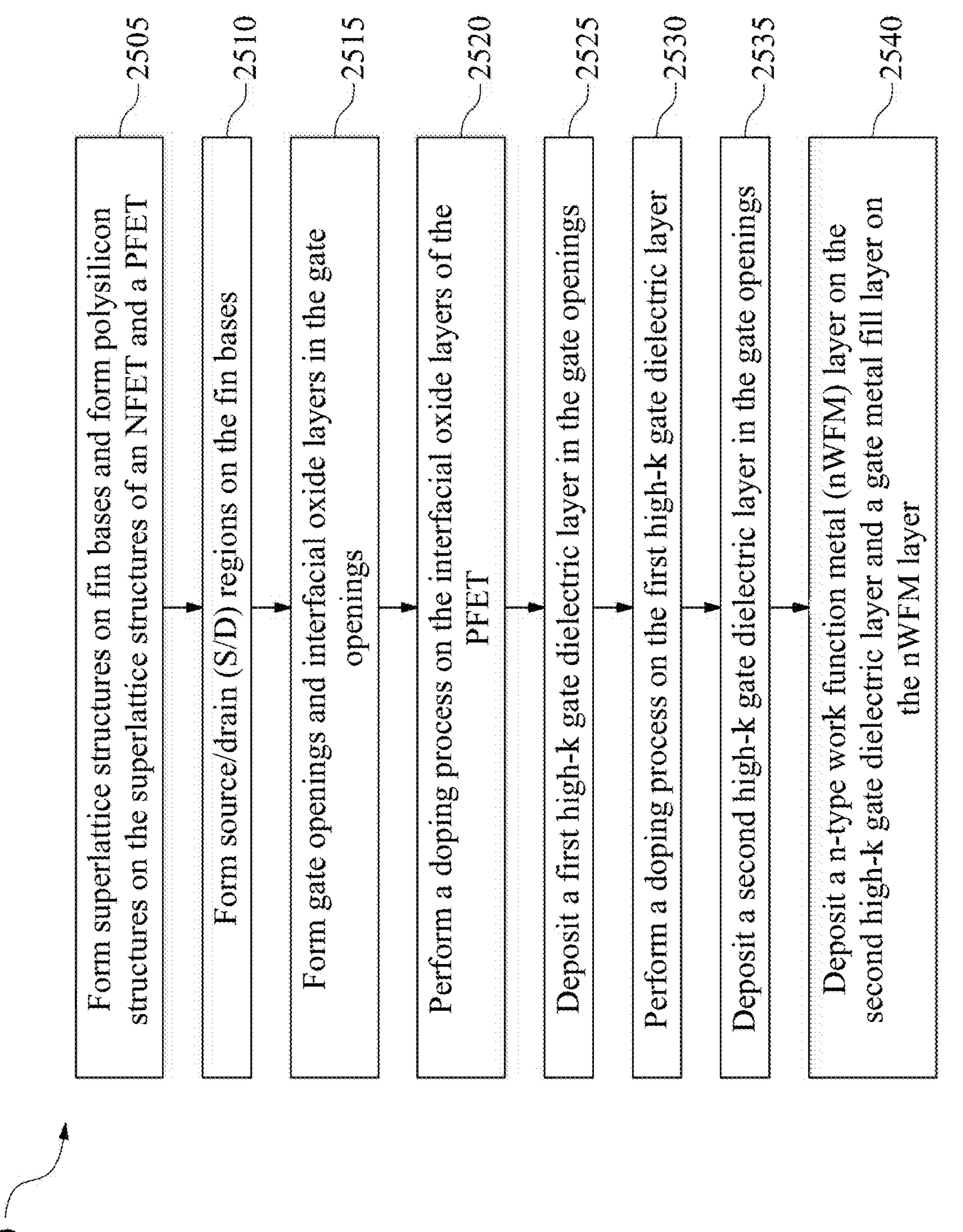
FIG. 25 is a flow diagram of a method for fabricating another semiconductor device with different gate structures, in accordance with some embodiments.

FIG. 25 is a flow diagram of an example method 2500 for fabricating NFET 102N and PFET 102P with cross-sectional views shown in FIGS. 1B-1C and 1F-1G, according to some embodiments. For illustrative purposes, the operations illustrated in FIG. 25 will be described with reference to the example fabrication process for fabricating NFET 102N and PFET 102P as illustrated in FIGS. 3A, 8A-22B, and 26A-29B. FIGS. 3A, 8A-22A, and 26A-29A are cross-sectional views of NFET 102N along line A-A of FIG. 1A, and FIGS. 3B, 8B-22B, and 26B-29B are cross-sectional views of PFET 102P along line B-B of FIG. 1A at various stages of fabrication, according to some embodiments. Operations can be performed in a different order or not performed depending on specific applications. It should be noted that method 2500 may not produce a complete NFET 102N and PFET 102P. Accordingly, it is understood that additional processes can be provided before, during, and after method 2500, and that some other processes may only be briefly described herein. Elements in FIGS. 26A-29B with the same annotations as elements in FIGS. 1A-1E and 3A-22B are described above.

Referring to FIG. 25, operations 2505-2510 are similar to operations 205-210 of FIG. 2. After operation 2510, structures similar to the structures of FIGS. 3A and 3B are formed. The subsequent processing on the structures of FIGS. 3A and 3B in operation 2515 is described with reference to FIGS. 26A-26B.

Referring to FIG. 25, in operation 2515, gate openings are formed and IL layers are formed in the gate openings. For example, as described with reference to FIGS. 26A and 26B, gate openings 412N1-412N3 and 412P1-412P3 and IL layers 122N1-122N3 and 2622P1-2622P3 are formed. IL layers 122N1-122N3 are formed in gate openings 412N1-412N3 and IL layers 2622P1-2622P3 are formed in gate openings 412P1-412P3. In some embodiments, IL layers 122N1-122N3 and 2622P1-2622P3 can be formed by performing the wet oxidation process, as described in operation 215, on the exposed surfaces of nanostructured channel region 121N and 121P and fin or sheet bases 106N and 106P in gate openings 412N1-412N3 and 412P1-412P3. The wet oxidation process can oxidize top portions of nanostructured channel region 121N and fin or sheet base 106N to form IL layers 122N1-122N3 and can oxidize top portions of nanostructured channel region 121P and fin or sheet base 106P to form IL layers 2622P1-2622P3.

Figure 26A:
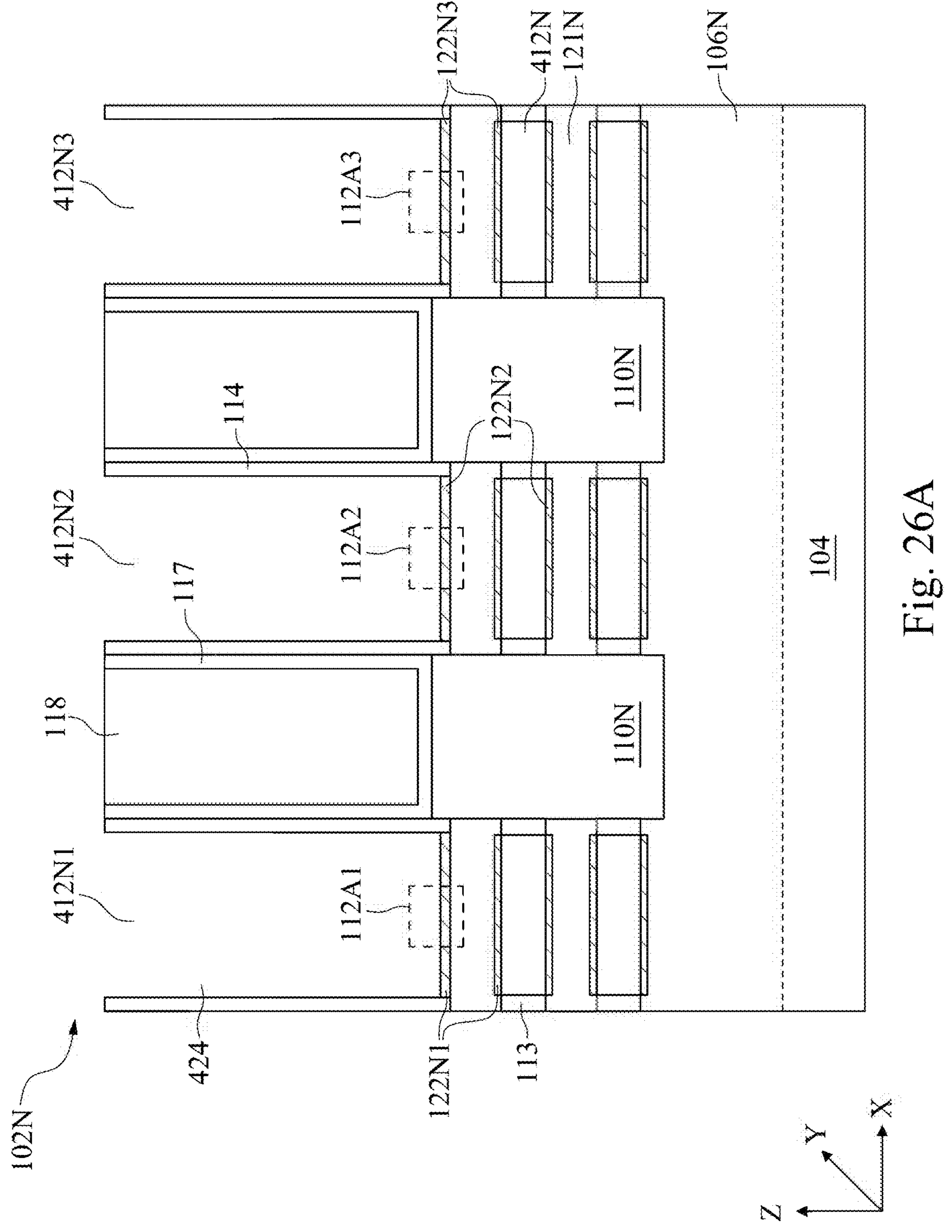
Figure 26B:
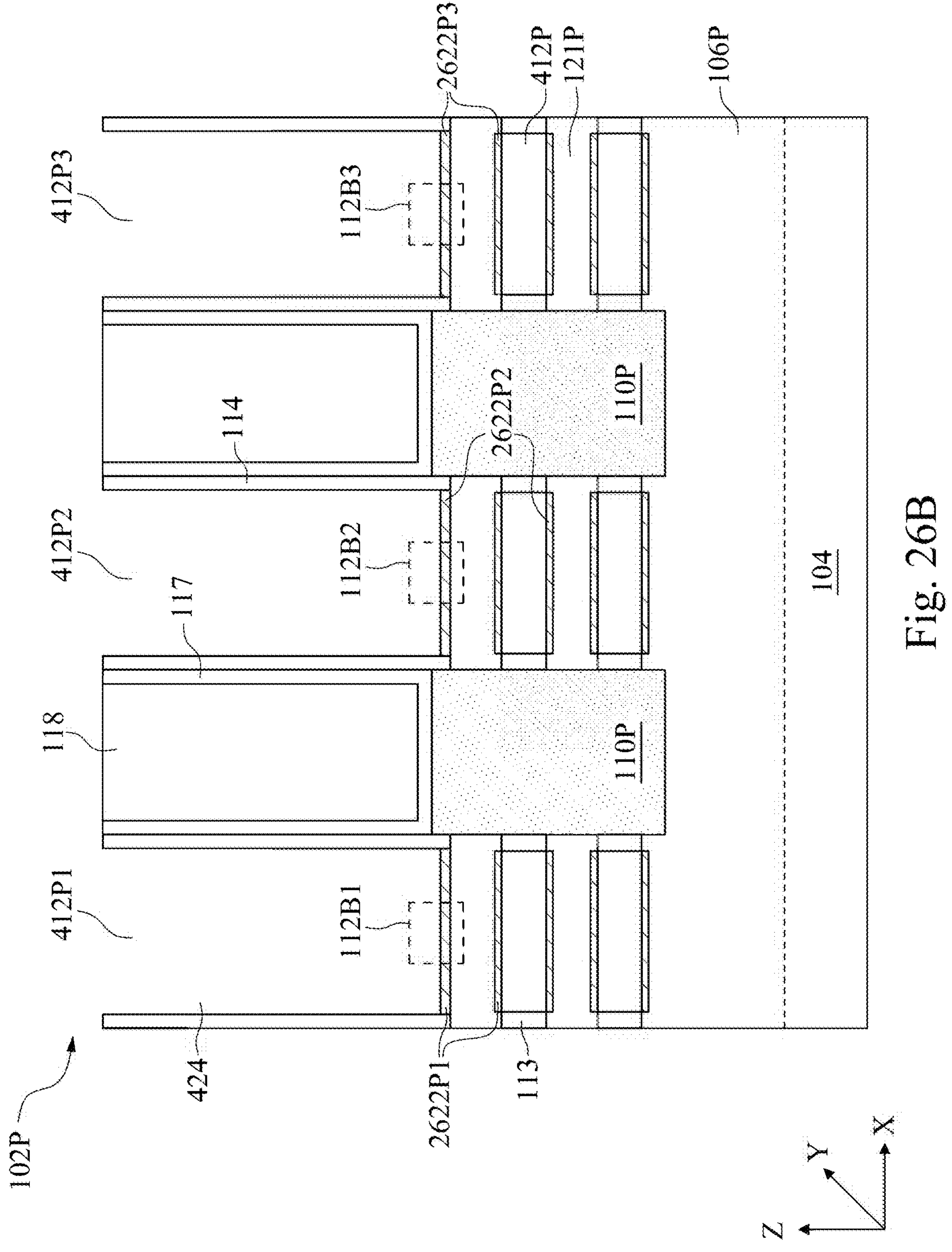

The subsequent processing on the structures of FIGS. 26A and 26B in operation 220 is described with reference to FIGS. 27A-29B. FIGS. 27A-29A are enlarged views of regions 112A1-112A3 of FIG. 26A, and FIGS. 27B-29B are enlarged views of regions 112B1-112B3 of FIG. 26B.

Referring to FIG. 25, in operation 2520, a doping process is performed on the IL layers of the PFET. For example, as described with reference to FIGS. 27A-29B, a doping process is performed to dope IL layers 2622P1-2622P3 with metal dopants that induce P-dipoles of dipole layers 140P. The doping process can include sequential operations of (i) depositing a dopant source layer 2744 on IL layers 122N1-122N3 and 2622P1-2622P3, as shown in FIGS. 27A and 27B, (ii) selectively removing portions of dopant source layer 2744 on IL layers 122N1-122N3 using lithographic patterning and etching processes, as shown in FIG. 28A, (iii) performing a drive-in anneal process on the structures of FIGS. 28A and 28B to implant metal dopants into IL layers 2622P1-2622P3 to form doped IL layers 122P1-122P3, as shown in FIG. 28B, and (iv) removing dopant source layer 2744 from the structures of FIG. 28B to form the structures of FIG. 29B.

The deposition of dopant source layer 2744 can include depositing a metal oxide, which includes a metal with a higher electronegativity than that of a metal (e.g., Hf, Zr) in HK gate dielectric layers 124P1-124P3. In some embodiments, depositing the metal oxide can include depositing $GeO_2$, germanium nitride (GeN), ZnO, zinc nitride (ZnN), antimony oxide (SbO), antimony nitride (SbN), tungsten oxide (WO), or tungsten nitride (WN) on IL layers 122N1-122N3 and 2622P1-2622P3 in a CVD process or an ALD process. In some embodiments, depositing the metal oxide can include depositing the metal oxide with a thickness of about 0.5 nm to about 1 nm on IL layers 122N1-122N3 and 2622P1-2622P3 to adequately perform the doping process without compromising device manufacturing cost.

The drive-in anneal process can implant metal dopants into IL layers 2622P1-2622P3 through diffusion of metal atoms from dopant source layer 2744 into IL layers 2622P1-2622P3. The drive-in anneal process can include annealing the structures of FIGS. 28A and 28B at a temperature of about 500° C. to about 700° C. for a time period of about 10 seconds to about 30 seconds in an ambient of nitrogen.

Figures 27A, 27B:
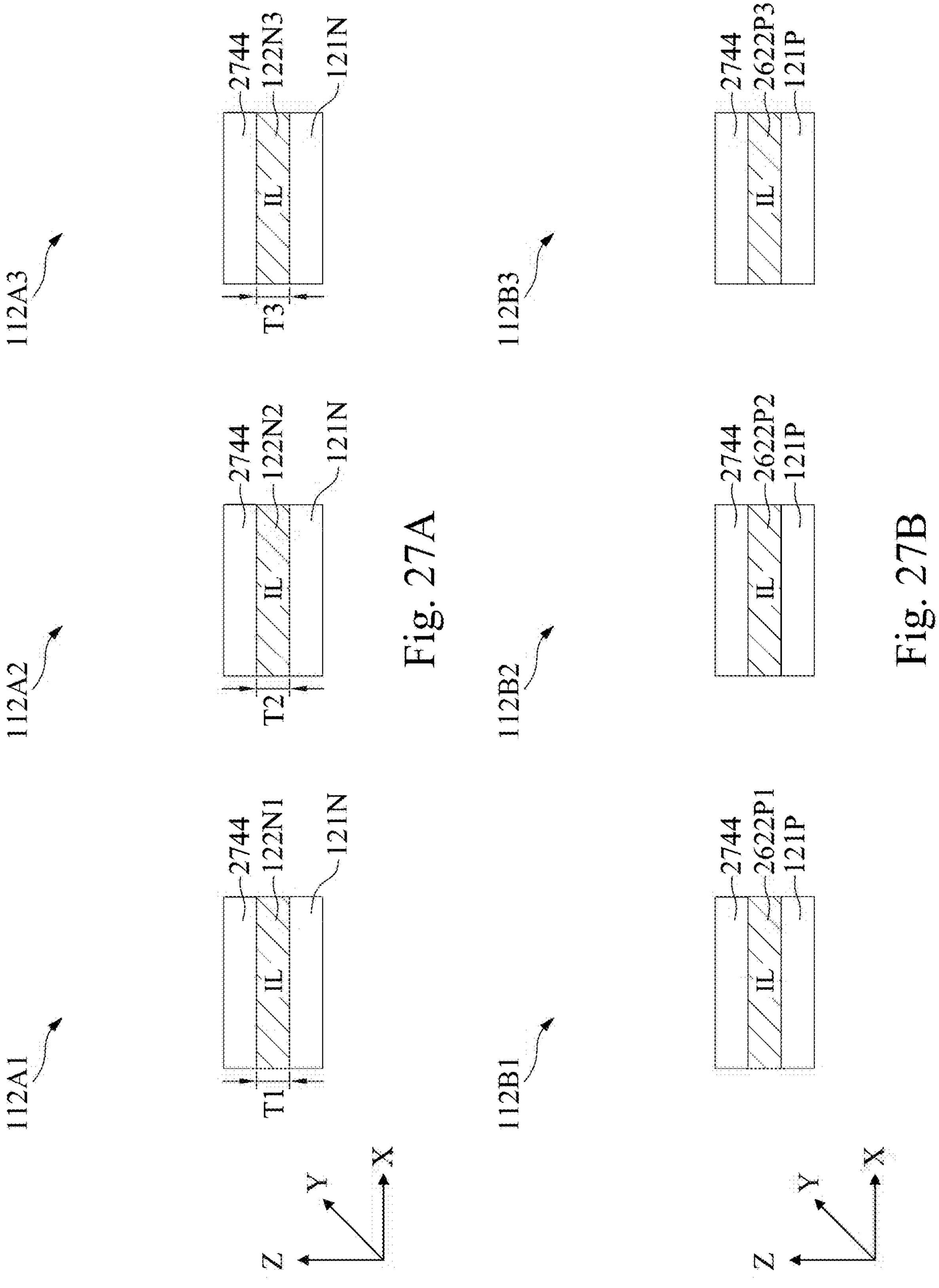
Figures 28A, 28B:
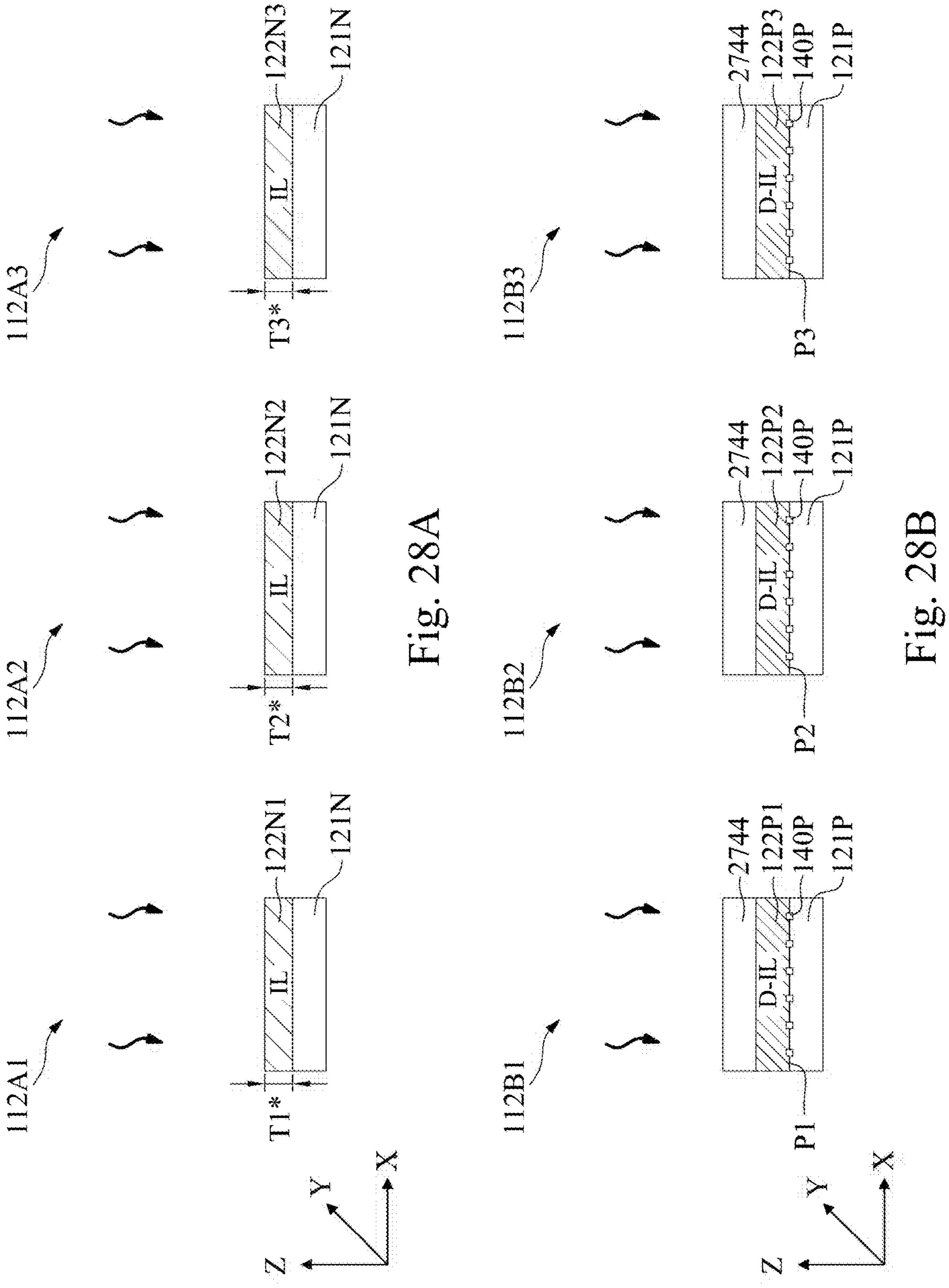
Figures 29A, 29B:
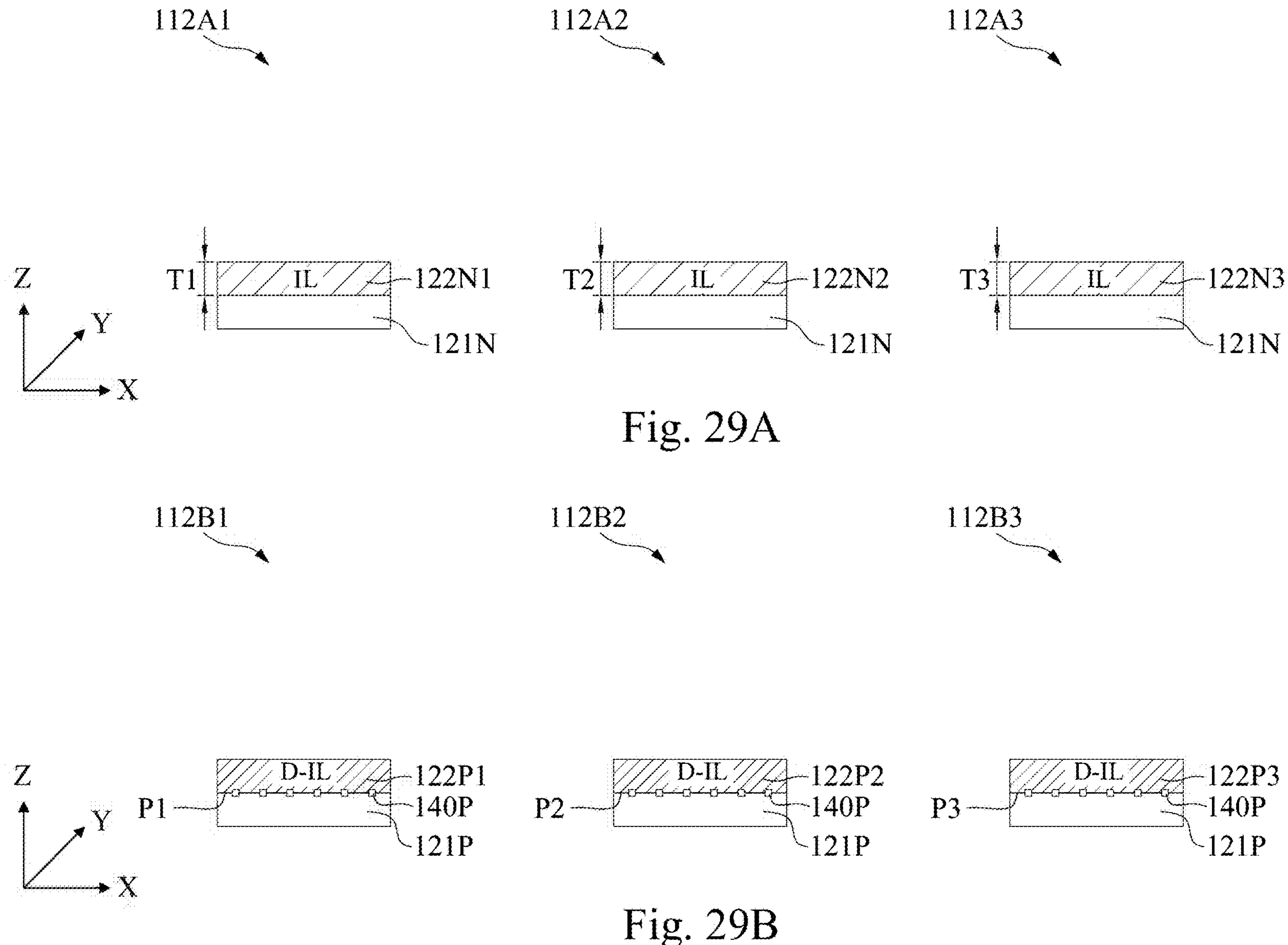

In some embodiments, portions of IL layers 122N1-122N3 can be etched during the etching of dopant source layer 2744 from the structures of FIG. 27A. As a result, IL layers 122N1-122N3 can be reduced from thicknesses T1-T3 (shown in FIG. 27A) to thicknesses T1*-T3* (shown in FIG. 28A). An oxidation process can be performed on the structures of FIGS. 28A and 28B after the removal of dopant source layer 2744 from the structures of FIG. 28B to regrow IL layers 122N1-122N3 to thicknesses T1-T3, as shown in FIG. 29A. In some embodiments, the oxidation process can include the wet oxidation process described in operation 215. In some embodiments, thicknesses of IL layers 122N1-122N3 and 122P1-122P3 can be substantially equal to each other after the oxidation process.

Referring to FIG. 25, operations 2525-2540 are similar to operations 225-240, respectively, of FIG. 2, except in operation 2540 an nWFM layer is deposited on second HK gate dielectric layer 2227 instead of pWFM layer 2226. Operations 2525-2540 are performed on the structures of FIGS. 29A and 29B to form the structures of FIGS. 1B-1C and 1F-1G.

The present disclosure provides example GAA FETs (e.g., GAA FET 102N and 102P) with different gate structures (e.g., gate structures 112N1-112N3 and 112P1-112P3) configured to provide different threshold voltages, and example methods (e.g., methods 200 and 2500) of forming such multi-Vt GAA FETs on the same substrate (e.g., substrate 104). The example methods form NFETs (e.g., NFET 102N) and PFETs (e.g., PFET 102P) with WFM layers (e.g., WFM layers 126) of the same material and of substantially equal thicknesses, and with extreme-low, ultra-low, and/or low threshold voltages, on the same substrate. These example methods can be more cost-effective (e.g., reduce cost by about 20% to about 30%) and time-efficient (e.g., reduce time by about 15% to about 20%) in manufacturing reliable GAA FET gate structures with different threshold voltages than other methods of forming GAA FETs with similar dimensions and threshold voltages on the same substrate. In addition, these example methods can form GAA FET gate structures with much smaller dimensions (e.g., thinner gate stacks) than other methods of forming GAA FETs with similar threshold voltages.

In some embodiments, NFETs and PFETs with different gate structure configurations (e.g., gate structures 112N1-112N3 and 112P1-112P3), but with WFM layers (e.g., WFM layers 126) of the same material and of substantially equal thicknesses can be formed on the same substrate to achieve different threshold voltages. The different gate structures can have HK gate dielectric layers (e.g., doped HK gate dielectric layers 125N1-125N3 and 125P1-125P3) doped with metal dopants of different types and/or concentrations that induce N-dipoles and P-dipoles of different concentrations at HK-IL interfaces (e.g., HK-IL interfaces N4-N5 and P4-P5). The N-dipoles and P-dipoles of different concentrations at HK-IL interfaces result in gate structures with different threshold voltages on the same substrate. Thus, controlling the types and/or concentrations of metal dopants in the HK gate dielectric layers can tune the threshold voltages of the NFETs and PFETs without varying the WFM layer thicknesses. And, forming the NFET and PFET gate structures with WFM layers of the same material can reduce the number of fabrication steps and as a result, reduce device manufacturing cost compared to NFET and PFET gate structures formed with WFM layers of different materials.

In some embodiments, both the NFET and PFET gate structures can be formed with nWFM layers or pWFM layers. In some embodiments, when both the NFET and PFET gate structures are formed with pWFM layers (e.g., pWFM layers 126 of FIGS. 1D-1E) in addition to the dipoles at the HK-IL interfaces, the PFETs can be formed to have extreme-low, ultra-low, and/or low threshold voltages. However, additional N-dipoles are formed at IL-channel interfaces (e.g., IL-channel interfaces N1-N3) of the NFETs to form the NFETs with extreme-low, ultra-low, and/or low threshold voltages. These additional dipoles can be formed by doping the NFET IL layers (e.g., IL layers 122N1-122N3) with metal dopants that include a lower electronegativity than that of a metal (e.g., Hf, Zr) in the NFET HK gate dielectric layers (e.g., HK gate dielectric layers 124N1-124N3). In some embodiments, the metal dopants in the NFET IL layers can include La, Lu, Sc, Y, Tm, or Gd.

On the other hand, in some embodiments, when both the NFET and PFET gate structures are formed with nWFM layers (e.g., nWFM layers 126 of FIGS. 1F-1G) in addition to the dipoles at the HK-IL interfaces, the NFET can be formed to have extreme-low, ultra-low, and/or low threshold voltages. However, additional P-dipoles are formed at IL-channel interfaces (e.g., IL-channel interfaces P1-P3) of the PFETs to form the PFETs with extreme-low, ultra-low, and/or low threshold voltages. These additional dipoles can be formed by doping the PFET IL layers with metal dopants that include a higher electronegativity than that of a metal (e.g., Hf, Zr) in the PFET HK gate dielectric layers (e.g., HK gate dielectric layers 124P1-124P3). In some embodiments, the metal dopants can include Ge, Zn, Sb, or W.

In some embodiments, a method includes forming nanostructured channel regions on a fin or sheet base, forming gate openings surrounding the nanostructured channel regions, forming oxide layers on exposed surfaces of the nanostructured channel regions and the fin or sheet base in the gate openings, performing a first doping process on the oxide layers to form doped oxide layers, depositing a first dielectric layer on the doped oxide layers, performing a second doping process on the first dielectric layer to form a doped dielectric layer, and depositing a conductive layer on the doped dielectric layer.

In some embodiments, a method includes forming first and second nanostructured channel regions on first and second fin or sheet bases, respectively, forming first and second gate openings surrounding the first and second nanostructured channel regions, respectively, forming a first undoped oxide layer on exposed surfaces of the first nanostructured channel region in the first gate opening, forming a doped oxide layer on exposed surfaces of the second nanostructured channel region in the second gate opening, depositing a first dielectric layer with a first dielectric portion on the undoped oxide layer and a second dielectric portion the doped oxide layer, performing a doping process on the first and second dielectric portions to form first and second doped dielectric portions, respectively, and depositing a conductive layer on the first and second doped dielectric portions.

In some embodiments, a semiconductor device includes a substrate, a nanostructured channel region disposed on the substrate, and a gate structure. The gate structure includes a doped oxide layer surrounding the nanostructured channel region, a doped dielectric layer disposed on the doped oxide layer, a first dipole layer disposed between the doped oxide layer and the nanostructured channel region, and a second dipole layer disposed between the doped oxide layer and the doped dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming nanostructured channel regions on a fin or sheet base;

forming gate openings surrounding the nanostructured channel regions;

forming oxide layers in contact with exposed surfaces of the nanostructured channel regions and the fin or sheet base in the gate openings;

performing a first doping process on the oxide layers to form doped oxide layers in contact with exposed surfaces of the nanostructured channel regions and the fin or sheet base in the gate openings;

depositing a first dielectric layer on the doped oxide layers;

performing a second doping process on the first dielectric layer to form a doped dielectric layer; and depositing a conductive layer on the doped dielectric layer.

2. The method of claim 1, wherein forming the oxide layers comprises performing a wet oxidation process on the exposed surfaces of the nanostructured channel regions and the fin or sheet base in the gate openings.

3. The method of claim 1, wherein performing the first doping process comprises:

depositing a dopant source layer on the oxide layers; and performing an anneal process on the dopant source layer.

4. The method of claim 1, wherein performing the first doping process comprises implanting, into the oxide layers, metal dopants with an electronegativity lower than that of a metal of the first dielectric layer.

5. The method of claim 1, wherein performing the first doping process comprises implanting, into the oxide layers, metal dopants with an electronegativity lower than hafnium; and wherein depositing the conductive layer comprises depositing a p-type work function metal on the doped dielectric layer.

6. The method of claim 1, wherein performing the first doping process comprises depositing a layer of lanthanum oxide ($La_2O_3$), lutetium oxide (LuO), scandium oxide (ScO), yttrium oxide ($Y_2O_3$), thulium oxide ($Tm_2O_3$), or gadolinium oxide ($Gd_2O_3$) on the oxide layers; and wherein depositing the conductive layer comprises depositing a p-type work function metal on the doped dielectric layer.

7. The method of claim 1, wherein performing the second doping process comprises:

depositing a rare-earth metal-based dopant source layer on the first dielectric layer; and performing an anneal process on the rare-earth metal-based dopant source layer.

8. The method of claim 1, further comprising depositing a second dielectric layer on the doped dielectric layer prior to depositing the conductive layer.

9. A method, comprising:

forming first and second nanostructured channel regions on first and second fin or sheet bases, respectively;

forming first and second gate openings surrounding the first and second nanostructured channel regions, respectively;

forming a first undoped oxide layer in contact with exposed surfaces of the first nanostructured channel region in the first gate opening;

forming a doped oxide layer in contact with exposed surfaces of the second nanostructured channel region in the second gate opening;

depositing a first dielectric layer with a first dielectric portion on the first undoped oxide layer and a second dielectric portion on the doped oxide layer;

performing a doping process on the first and second dielectric portions to form first and second doped dielectric portions, respectively; and depositing a conductive layer on the first and second doped dielectric portions.

10. The method of claim 9, wherein forming the doped oxide layer comprises:

forming a second undoped oxide layer on the exposed surfaces of the second nanostructured channel region;

depositing a dopant source layer on the first and second undoped oxide layers;

removing a portion of the dopant source layer on the first undoped oxide layer; and performing an anneal process on the dopant source layer.

11. The method of claim 9, wherein forming the doped oxide layer comprises:

forming a second undoped oxide layer on the exposed surfaces of the second nanostructured channel region; and implanting, into the second undoped oxide layer, metal dopants with an electronegativity lower than hafnium.

12. The method of claim 9, further comprising performing a wet oxidation process on the first undoped oxide layer after forming the doped oxide layer.

13. The method of claim 9, wherein performing the doping process on the first and second dielectric portions comprises:

depositing a first dopant source layer on the first and second dielectric portions; and removing a portion of the first dopant source layer on the second dielectric portion.

14. The method of claim 13, wherein performing the doping process on the first and second dielectric portions comprises:

depositing a second dopant source layer on the first dopant source layer and the second dielectric portion; and removing a portion of the second dopant source layer on the first dopant source layer.

15. A semiconductor device, comprising:

a substrate;

a nanostructured channel region disposed on the substrate; and a gate structure, comprising:

a doped oxide layer surrounding and in contact with the nanostructured channel region;

a doped dielectric layer disposed on the doped oxide layer;

a first dipole layer disposed between the doped oxide layer and the nanostructured channel region; and a second dipole layer disposed between the doped oxide layer and the doped dielectric layer.

16. The semiconductor device of claim 15, wherein the first dipole layer comprises dipoles of a first metal; and wherein the second dipole layer comprises dipoles of a second metal different from the first metal.

17. The semiconductor device of claim 15, wherein the first dipole layer comprises dipoles of a metal with an electronegativity lower than that of a metal of the doped dielectric layer.

18. The semiconductor device of claim 15, wherein the gate structure further comprises:

an undoped dielectric layer disposed on the doped dielectric layer; and a conductive layer disposed on the undoped dielectric layer.

19. The method of claim 8, wherein depositing the second dielectric layer comprises depositing an undoped high-k dielectric layer.

20. The method of claim 1, wherein performing the second doping process comprises:

depositing a first dopant source layer on the first dielectric layer; and depositing a second dopant source layer on the first dopant source layer, wherein the first and second dopant sources layers are different from each other.

* * * * *